(12) United States Patent
Bae et al.

(10) Patent No.: US 12,068,323 B2
(45) Date of Patent: Aug. 20, 2024

(54) SEMICONDUCTOR DEVICES AND METHODS FOR FABRICATING THE SAME

(71) Applicant: Samsung Electronics Co., Ltd., Suwon-si (KR)

(72) Inventors: Deok Han Bae, Suwon-si (KR); Ju Hun Park, Seoul (KR); Myung Yoon Um, Seoul (KR); Ye Ji Lee, Seoul (KR); Yoon Young Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 17/511,923

(22) Filed: Oct. 27, 2021

(65) Prior Publication Data

US 2022/0262797 A1 Aug. 18, 2022

(30) Foreign Application Priority Data

Feb. 18, 2021 (KR) ........................ 10-2021-0021795

(51) Int. Cl.
*H01L 27/092* (2006.01)
*H01L 23/528* (2006.01)
*H01L 29/06* (2006.01)
*H01L 29/417* (2006.01)
(Continued)

(52) U.S. Cl.
CPC ........ *H01L 27/0924* (2013.01); *H01L 23/528* (2013.01); *H01L 29/0665* (2013.01); *H01L 29/41791* (2013.01); *H01L 29/42392* (2013.01); *H01L 29/78696* (2013.01)

(58) Field of Classification Search
CPC ............... H01L 27/0924; H01L 23/528; H01L 29/0665; H01L 29/41791; H01L 29/42392; H01L 29/78696; H01L 21/76883; H01L 23/5221; H01L 21/76816; H01L 23/485; H01L 23/5226; H01L 21/823475; H01L 29/41783; H01L 21/823418; G11C 5/14–148; G09G 2330/00–028
See application file for complete search history.

(56) References Cited

U.S. PATENT DOCUMENTS 10,312,332 B2 6/2019 Liaw
10,748,896 B2 8/2020 Chang et al.
10,777,647 B2 9/2020 Cheng et al.
(Continued)

FOREIGN PATENT DOCUMENTS

KR 20210151277 A 12/2021

*Primary Examiner* — Shahed Ahmed
(74) *Attorney, Agent, or Firm* — Myers Bigel, P.A.

(57) ABSTRACT

A semiconductor device includes a substrate having a first power supply region, a second power supply region, and a cell region therein. The cell region extends between the first power supply region and the second power supply region. A first active region and a second active region are provided, which extend side-by-side within the cell region. A first power supply wiring is provided, which extends in the first direction within the first power supply region. A first source/drain contact is provided, which connects the first active region and the second active region. A second source/drain contact is provided, which connects the first active region and the first power supply wiring. The first source/drain contact includes a first recess portion disposed inside an intermediate region between the first active region and the second active region.

20 Claims, 36 Drawing Sheets

(51) Int. Cl.
*H01L 29/423* (2006.01)
*H01L 29/786* (2006.01)

(56) References Cited

U.S. PATENT DOCUMENTS

| | | | |
|---|---|---|---|
| 2007/0300202 A1* | 12/2007 | Uchida | H03K 19/094 |
| | | | 257/499 |
| 2018/0090492 A1* | 3/2018 | Ranjan | H01L 23/5283 |
| 2019/0080969 A1 | 3/2019 | Tsao | |
| 2019/0206867 A1 | 7/2019 | Lee et al. | |
| 2019/0393205 A1* | 12/2019 | Lee | G06F 30/392 |
| 2020/0058744 A1 | 2/2020 | Wang et al. | |
| 2020/0075421 A1 | 3/2020 | Wu et al. | |

* cited by examiner

SEMICONDUCTOR DEVICES AND METHODS FOR FABRICATING THE SAME

REFERENCE TO PRIORITY APPLICATION

This application claims priority under 35 U.S.C. § 119 to Korean Patent Application No. 10-2021-0021795, filed Feb. 18, 2021, the contents of which are hereby incorporated herein by reference.

BACKGROUND

1. Field of the Disclosure

The present disclosure relates to semiconductor devices and methods for fabricating the same, and, more particularly, to semiconductor devices having source/drain contacts and methods for fabricating the same.

2. Description of the Related Art

Semiconductor devices are often spotlighted as important factors in the electronics industry due to their typical characteristics, such as miniaturization, multi-functionality and/or low fabricating cost. The semiconductor devices may be classified into a semiconductor storage device that stores logical data, a semiconductor logical device that performs a computing process of logical data, a hybrid semiconductor device, which includes a storage element and a logical element, and the like.

As the electronics industry develops to a high degree, demands for the characteristics of the semiconductor devices gradually increase. For example, there are increasing demands for high reliability, high speed, and/or multi-functionality of the semiconductor devices. In order to satisfy such required characteristics, the structures inside the semiconductor device are increased in complexity and made more highly integrated.

SUMMARY

Aspects of the present disclosure provide a semiconductor device in which parasitic capacitance is reduced to improve device performance.

Aspects of the present disclosure also provide a method for fabricating a semiconductor device in which parasitic capacitance is reduced to improve device performance.

According to some aspects of the present inventive concept, there is provided a semiconductor device, which includes a first power supply region and a second power supply region extending in a first direction and side-by-side. A cell region is also provided between the first power supply region and the second power supply region. The semiconductor device also includes a substrate having a first active region and a second active region therein, which extend in the first direction, side-by-side, and within the cell region. A first power supply wiring is provided, which extends in the first direction inside the first power supply region. A first source/drain contact is provided, which connects the first active region and the second active region. A second source/drain contact is provided, which connects the first active region and the first power supply wiring. The first source/drain contact can include a first recess portion, which is placed inside an intermediate region between the first active region and the second active region. The second source/drain contact can include a second recess portion, which is placed inside the first power supply region. And, a lowermost surface of the first recess portion can be positioned higher than a lowermost surface of the second recess portion, relative to an upper surface of the substrate.

According to some aspects of the present inventive concept, there is provided a semiconductor device which includes a first cell region and a second cell region extending in a first direction side-by-side, and a power supply region between the first cell region and the second cell region. The semiconductor device includes a substrate having a first active region and a second active region therein, which extend in the first direction and side-by-side within the first cell region. A gate electrode is provided, which extends in a second direction intersecting the first direction, on the substrate. A power supply wiring is provided, which extends in the first direction inside the power supply region. A first source/drain contact is provided, which is connected to the first active region, on one side of the gate electrode. A second source/drain contact is provided, which connects the first active region and the power supply wiring, on the other side of the gate electrode. The first source/drain contact may include a first recess portion within an intermediate region between the first active region and the second active region, and the second source/drain contact may include a second recess portion within the power supply region. A lowermost surface of the first recess portion may be higher than a lowermost surface of the second recess portion, relative to an upper surface of the substrate.

According to additional aspects of the present inventive concept, there is provided a semiconductor device, which includes a first power supply region and a second power supply region extending in a first direction side by side. A cell region is provided between the first power supply region and the second power supply region. The semiconductor device includes a substrate having a first active region and a second active region therein, which extend in the first direction side-by-side inside the cell region. A first active pattern is provided, which extends in the first direction, on the first active region. A second active pattern is provided, which extends in the first direction, on the second active region. A gate electrode is provided, which extends in a second direction intersecting the first direction, and on the first active pattern and the second active pattern. An insulating film is provided, which covers the first active pattern, the second active pattern and the gate electrode. A first power supply wiring is provided, which extends in the first direction and provides a first power supply voltage inside the first power supply region. A second power supply wiring is provided, which extends in the first direction and provides a second power supply voltage (different from the first power supply voltage) inside the second power supply region. A first source/drain contact is provided, which connects a source/drain region of the first active pattern and a source/drain region of the second active pattern, inside the insulating film. A second source/drain contact is provided, which connects the source/drain region of the first active pattern and the first power supply wiring, inside the insulating film. In addition, the insulating film may include a first recess, which extends between the first active region and the second active region and has a first depth. A second recess may be provided, which is placed in the first power supply region and has a second depth deeper than the first depth. The first source/drain contact may also include a first recess portion that fills the first recess. The second source/drain contact may also include a second recess portion that fills the second recess.

According to some aspects of the present inventive concept, there is provided a method for fabricating a semiconductor device, which includes a first power supply region and a second power supply region extending in a first direction side-by-side, and a cell region extending between the first power supply region and the second power supply region. The method includes providing a substrate having a first active region and a second active region therein, which extending in the first direction side-by-side and inside the cell region. The method also includes forming a gate electrode extending in a second direction intersecting the first direction, on the substrate, and forming an insulating film which covers the gate electrode, on the substrate. A mask pattern is formed, which includes a first source/drain contact opening that overlaps the first active region and the second active region, and a second source/drain contact opening that overlaps the first active region and the first power supply region. A protective pattern is formed, which overlaps an intermediate region between the first active region and the second active region, and does not overlap the first power supply region. The insulating film is also etched, using the mask pattern and the protective pattern as an etching mask.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, a semiconductor device according to exemplary embodiments will be described referring to FIGS. 1 to 14.

Figure 1:
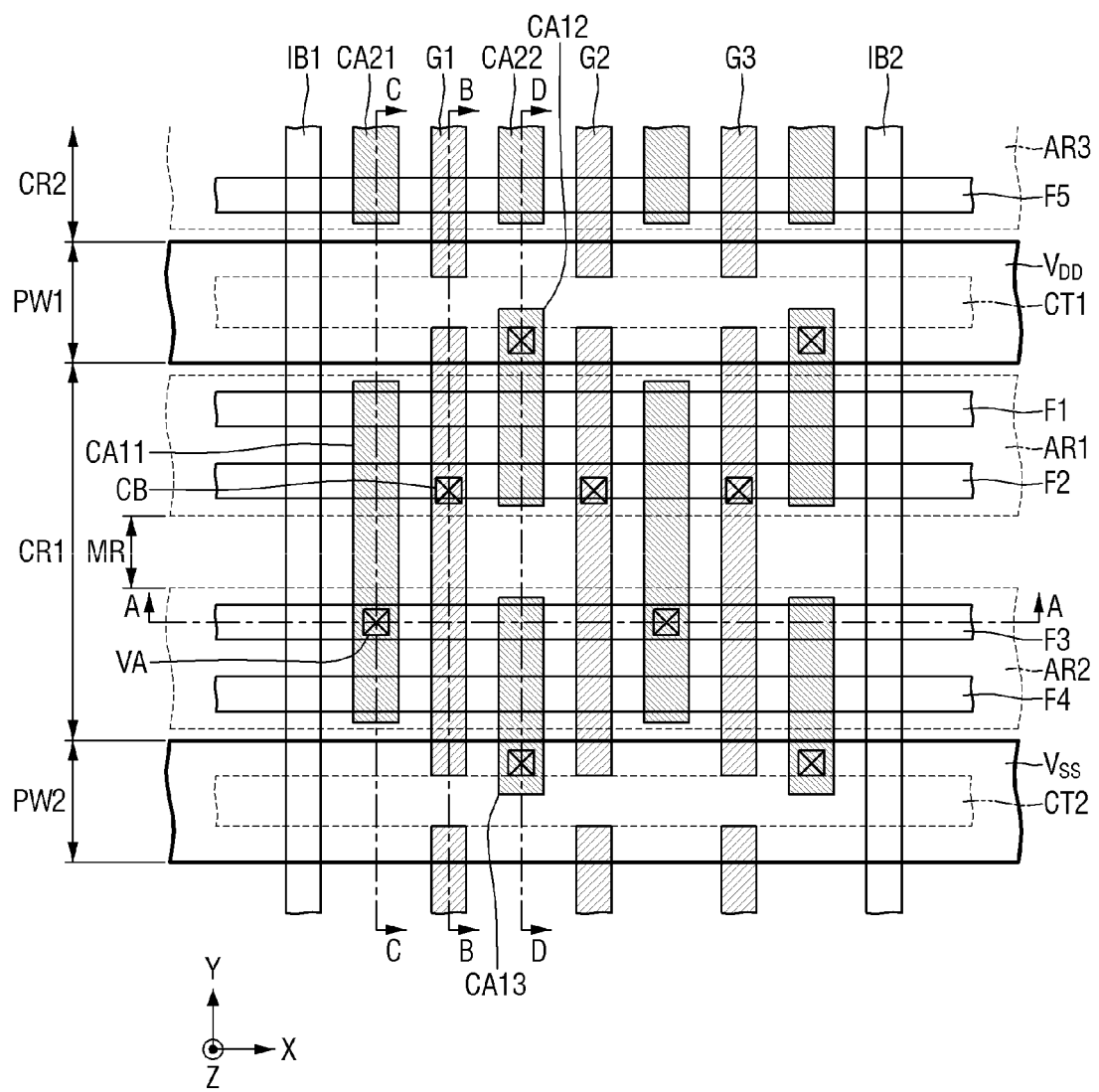
FIG. 1 is a schematic layout diagram for explaining a semiconductor device according to some embodiments.
Figure 2:
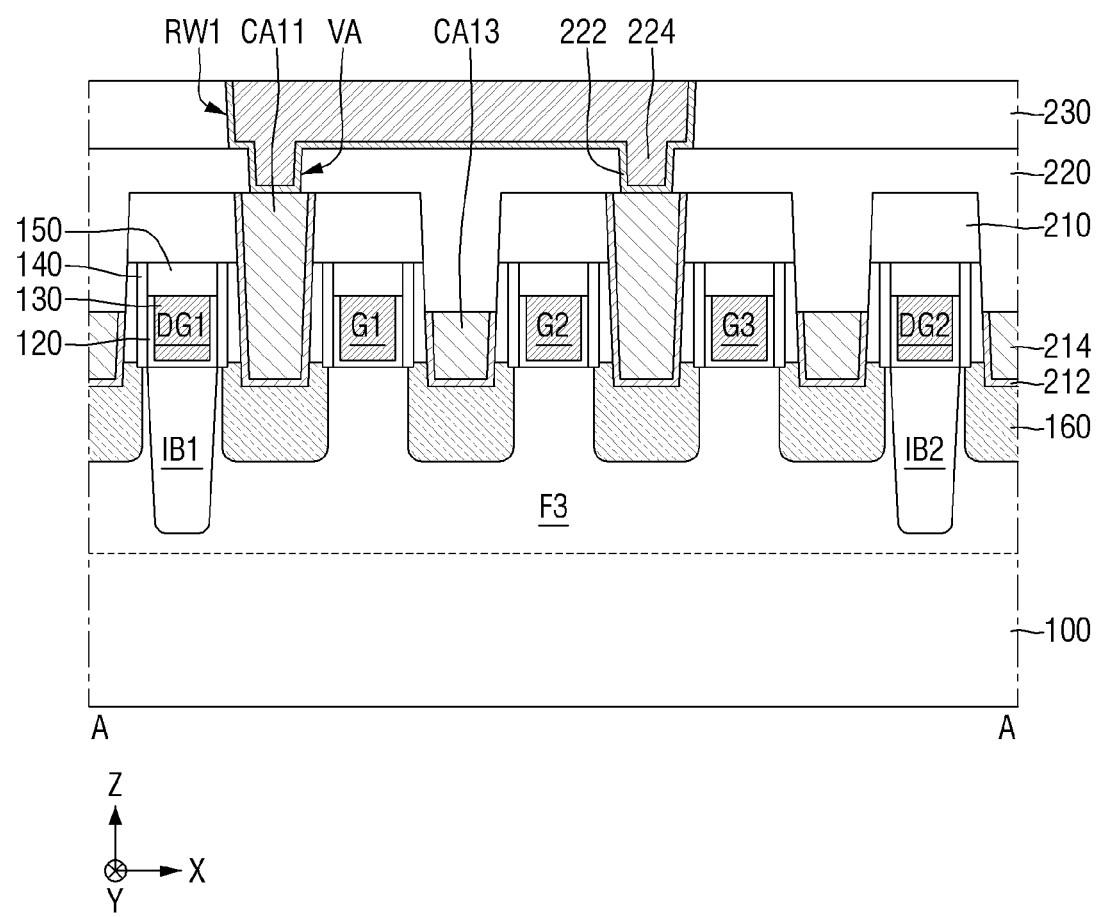
FIG. 2 is a cross-sectional view taken along line A-A of FIG. 1.
Figure 3:
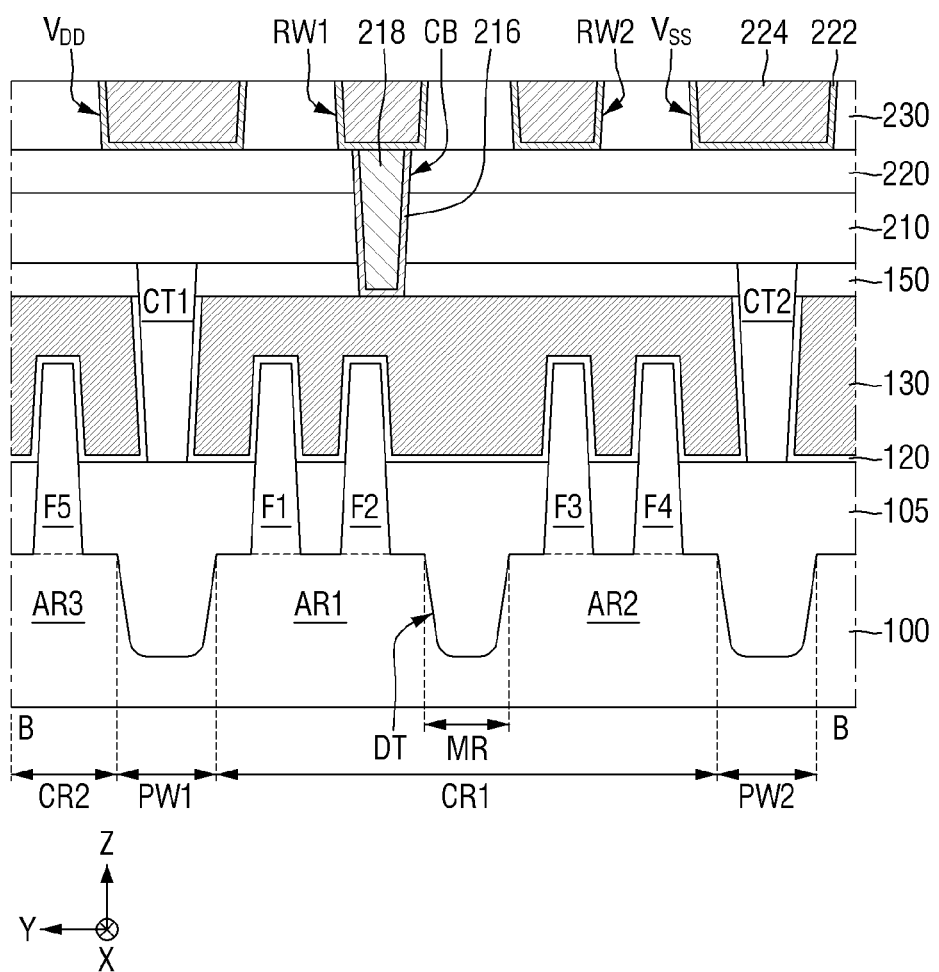
FIG. 3 is a cross-sectional view taken along line B-B of FIG. 1.
Figure 4:
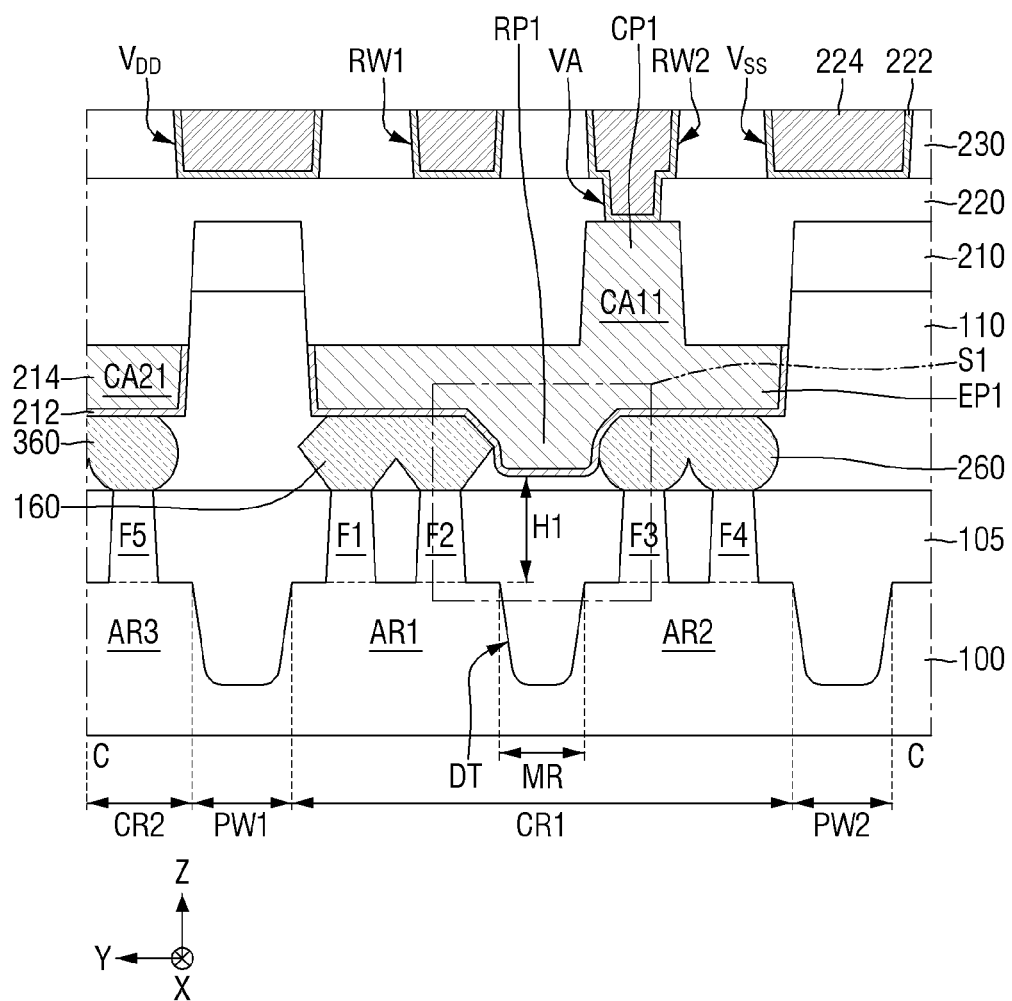
FIG. 4 is a cross-sectional view taken along line C-C of FIG. 1.
Figure 5A:
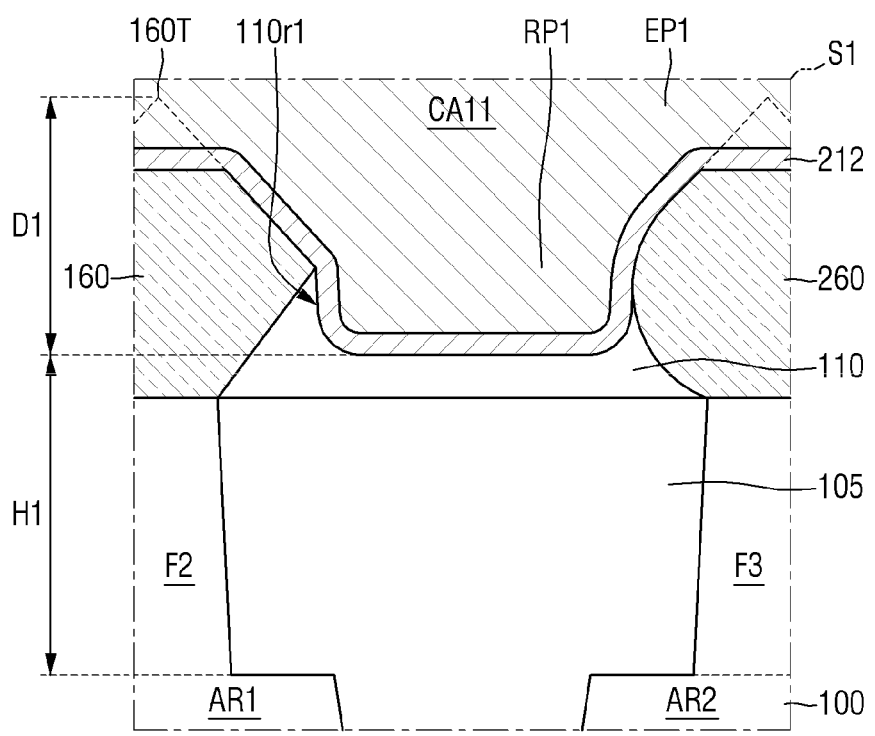
FIGS. 5a and 5b are enlarged views for explaining a central highlighted region S1 of FIG. 4.
Figure 5B:
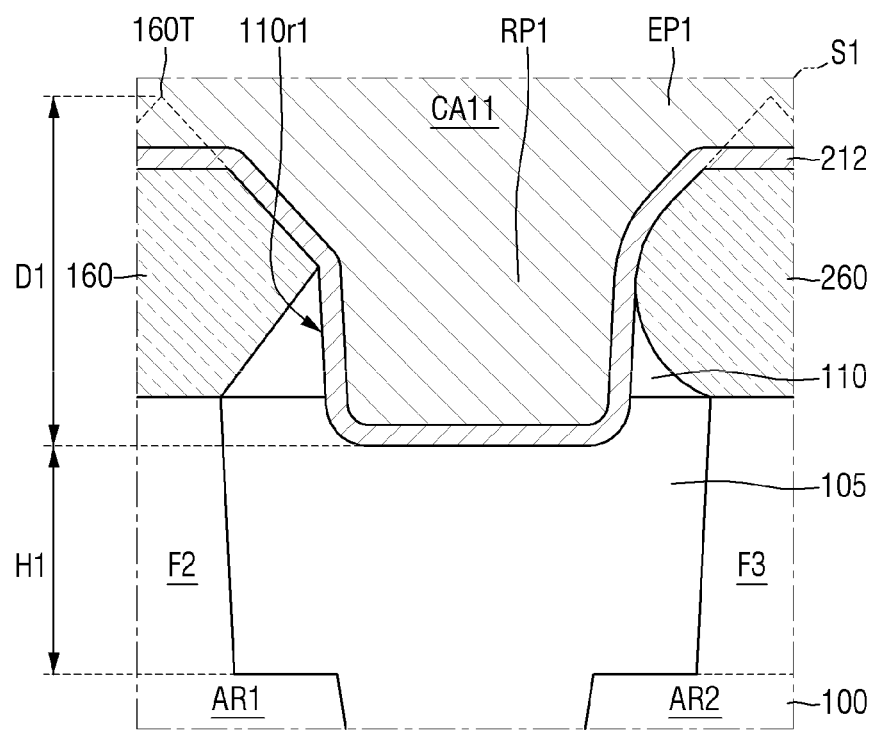
Figure 6:
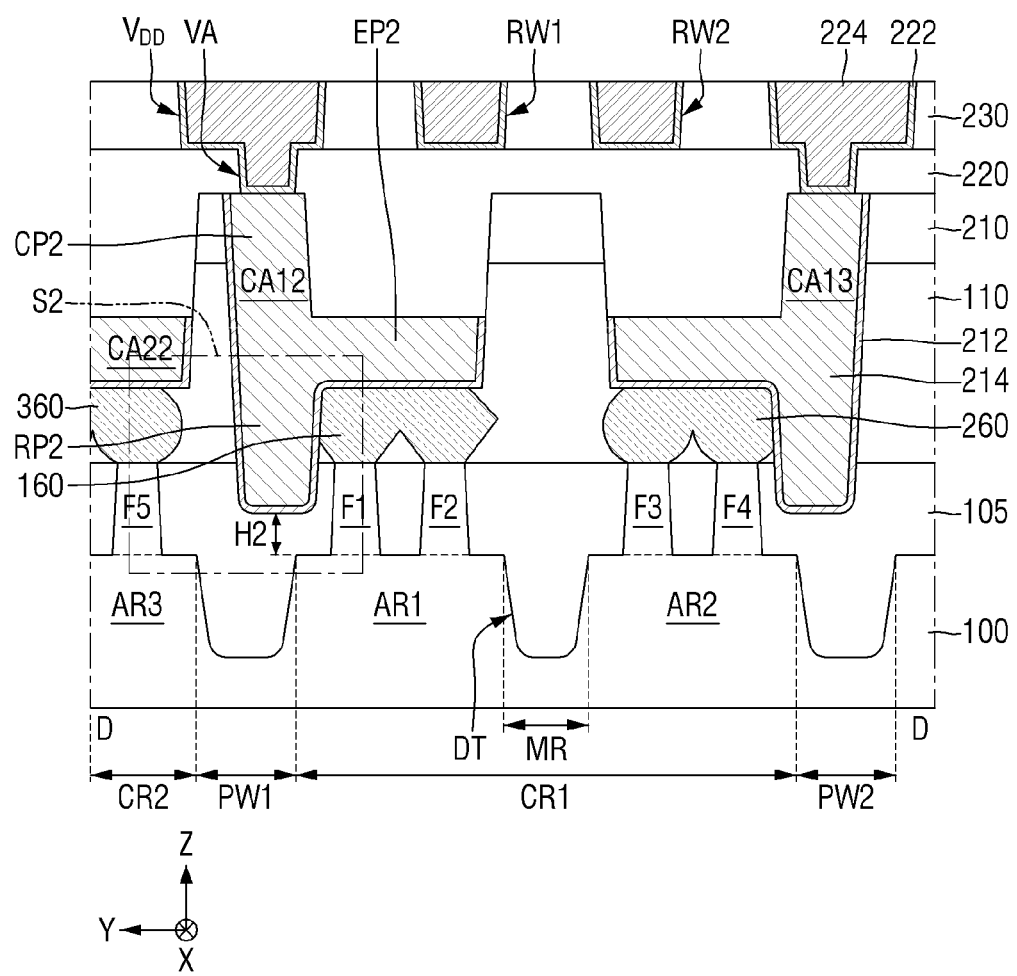
FIG. 6 is a cross-sectional view taken along line D-D of FIG. 1.
Figure 7:
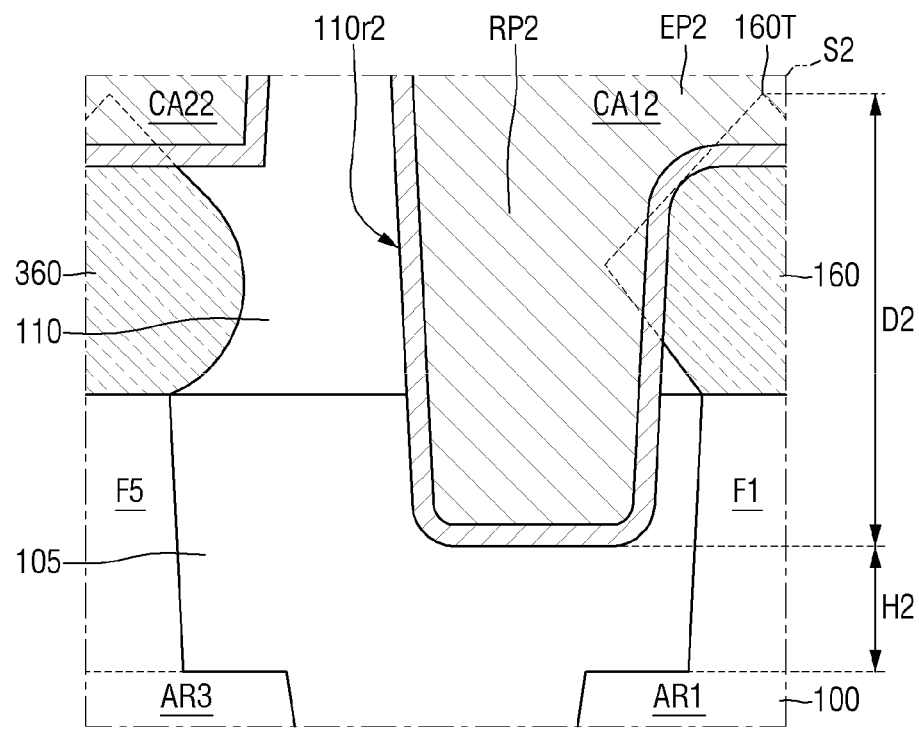
FIG. 7 is an enlarged view for explaining a highlighted region S2 of FIG. 6.

FIG. 1 is a schematic layout diagram for explaining a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIGS. 5a and 5b are enlarged views that highlight a region S1 in FIG. 4. FIG. 6 is a cross-sectional view taken along line D-D of FIG. 1. FIG. 7 is an enlarged view that highlights a region S2 of FIG. 6.

Referring to FIGS. 1 to 7, the semiconductor device according to some embodiments includes a first power supply region PW1, a second power supply region PW2, a first cell region CR1, and a second cell region CR2. The first power supply region PW1 and the second power supply region PW2 may be spaced apart from each other and extend side by side. For example, each of the first power supply region PW1 and the second power supply region PW2 may extend in a first direction X. Further, the first power supply region PW1 and the second power supply region PW2 may be spaced apart from each other in a second direction Y that intersects the first direction X (e.g., at right angles).

The first cell region CR1 may be interposed between the first power supply region PW1 and the second power supply region PW2. The second cell region CR2 may be spaced apart from the first cell region CR1 with the first power supply region PW1 interposed therebetween. That is, the first power supply region PW1 may be interposed between the first cell region CR1 and the second cell region CR2, as shown by FIG. 1.

In some embodiments, the first cell region CR1 and the second cell region CR2 may be defined between a first cell separation pattern IB1 and a second cell separation pattern IB2, which are spaced apart from each other along the first direction X. For example, the first cell separation pattern IB1 and the second cell separation pattern IB2 may extend side by side and longitudinally in the second direction Y. The first cell region CR1 and the second cell region CR2 may be defined between the first cell separation pattern IB1 and the second cell separation pattern IB2.

The first power supply region PW1 may provide a first power supply voltage to the first cell region CR1 and the second cell region CR2, and the second power supply region PW2 may provide a second power supply voltage different from the first power supply voltage to the first cell region CR1. For example, a first power supply wiring $V_{DD}$ extending in the first direction X may be placed inside the first power supply region PW1, and a second power supply wiring Vss extending in the first direction X may be placed inside the second power supply region PW2. The first power supply wiring $V_{DD}$ may provide a drain voltage, and the second power supply wiring Vss may provide a source voltage. As an example, the first supply voltage may be a positive (+) voltage, and the second supply voltage may be a ground GND voltage or a negative (−) voltage.

A semiconductor element (e.g., a transistor) may be provided inside each of the first cell region CR1 and the second cell region CR2. The semiconductor elements provided inside the first cell region CR1 and the second cell region CR2 may be various, but are not limited to, for example, a NAND cell, a NOR cell, and an XOR cell.

The semiconductor device according to some embodiments may include a substrate 100, active patterns/fins F1 to F5, gate electrodes G1 to G3, source/drain contacts CA11 to CA22, gate contacts CB, routing vias VA, and routing wirings RW1 and RW2. The number, the placement and the like of the active patterns F1 to F5, the gate electrodes G1 to G3, the source/drain contacts CA11 to CA22, the gate contacts CB, the routing vias VA and the routing wirings RW1 and RW2 are merely examples, and are not limited to those shown.

The substrate 100 may be bulk silicon or SOI (silicon-on-insulator). In contrast, the substrate 100 may be a silicon substrate, or may include other semiconductor materials, but are not limited to, for example, silicon germanium, SGOI (silicon germanium on insulator), indium antimonide, lead tellurium compound, indium arsenide, phosphide indium, gallium arsenide or gallium antimonide.

The substrate 100 may include a first active region AR1, a second active region AR2 and a third active region AR3. The first active region AR1 and the second active region AR2 may be placed inside the first cell region CR1, and the third active region AR3 may be placed inside the second cell region CR2. The first active region AR1, the second active region AR2 and the third active region AR3 may be spaced apart from each other and extend side by side in the first direction X. An intermediate region MR may be defined between the first active region AR1 and the second active region AR2.

In some embodiments, semiconductor elements (e.g., transistors) of different conductive types from each other may be formed on the first active region AR1 and the second active region AR2. Further, in some embodiments, semiconductor elements (e.g., transistors) of different conductive types from each other may be formed on the first active region AR1 and the third active region AR3. Hereinafter, the first active region AR1 will be described as a PFET region, and the second active region AR2 and the third active region AR3 will be described as an NFET region. However, this is merely an example, and it is a matter of course that the first active region AR1 may be the NFET region, and the second active region AR2 and the third active region AR3 may be the PFET region.

In some embodiments, the first active region AR1, the second active region AR2 and the third active region AR3 may be defined by the substrate trench DT. The substrate trench DT may be a deep trench formed inside the substrate 100. The substrate trench DT extends in the second direction Y, and may separate the first active region AR1, the second active region AR2 and the third active region AR3 from each other.

Active patterns F1 to F5 may be formed on the substrate 100. For example, a first active pattern F1 and a second active pattern F2 may be formed on the first active region AR1, a third active pattern F3 and a fourth active pattern F4 may be formed on the second active region AR2, and a fifth active pattern F5 may be formed on the third active region AR3. The active patterns F1 to F5 may be spaced apart from each other and extend side by side in the first direction X. In some embodiments, each of the active patterns F1 to F5 may include a fin-type pattern that protrudes from an upper surface of the substrate 100.

In some embodiments, a field insulating film 105 may be formed on the substrate 100. The field insulating film 105 may surround at least a part of the side surfaces of the active patterns F1 to F5. For example, as shown in FIG. 3, a part of the active patterns F1 to F5 may protrude upward from the field insulating film 105.

In some embodiments, the field insulating film 105 may fill a substrate trench DT. That is, the first active region AR1, the second active region AR2, and the third active region AR3 may be spaced apart from each other by the field insulating film 105.

The field insulating film 105 may include, but is not limited to, at least one of silicon oxide ($SiO_2$), silicon oxynitride (SiON), silicon oxycarbonitride (SiOCN) or combinations thereof.

The gate electrodes G1 to G3 may be formed on the active patterns F1 to F5. The gate electrodes G1 to G3 may intersect the active patterns F1 to F5, respectively. For example, a first gate electrode G1, a second gate electrode G2 and a third gate electrode G3, which are spaced apart from each other and extend side by side in the second direction Y, may be formed between the first cell separation pattern IB1 and the second cell separation pattern IB2.

In some embodiments, a first gate cutting pattern CT1 and a second gate cutting pattern CT2 that cut the gate electrodes G1 to G3 may be formed. The first gate cutting pattern CT1 may extend in the first direction X inside the first power supply region PW1 to cut the gate electrodes G1 to G3. The second gate cutting pattern CT2 may extend in the first direction X inside the second power supply region PW2 to cut the gate electrodes G1 to G3. Each of the first gate cutting pattern CT1 and the second gate cutting pattern CT2 may include, but is not limited to, at least one of silicon nitride (SiN), silicon oxynitride (SiON), silicon oxycarbonitride (SiOCN) or a combination thereof.

Each of the gate electrodes G1 to G3 may include a gate conductive film 130. The gate conductive film 130 may include, but is not limited to, at least one of Ti, Ta, W, Al, Co and a combination thereof. The gate conductive film 130 may also include, for example, a semiconductor, such as silicon or silicon germanium instead of metal.

Although the gate conductive film 130 is shown as a single film, the technical idea of the present disclosure is not limited thereto. Unlike the shown case, the gate conductive film 130 may also be formed by stacking a plurality of conductive materials into a gate stack. For example, the gate conductive film 130 may include a work function adjusting film that adjusts the work function, and a filling conductive film that fills a space formed by the work function adjusting film. The work function adjusting film may include, for example, at least one of TiN, TaN, TiC, TaC, TiAlC and a combination thereof. The filling conductive film may include, for example, W or Al. The gate conductive film 130 may be formed, but is not limited to, using a replacement process.

A gate dielectric film 120 may be interposed between the active patterns F1 to F5 and the gate conductive film 130. For example, the gate dielectric film 120 may extend along the side surfaces and the lower surface of the gate conductive film 130. However, the technical idea of the present disclosure is not limited thereto, and the gate dielectric film 120 may extend only along the lower surface of the gate conductive film 130.

In some embodiments, a part of the gate dielectric film 120 may be interposed between the field insulating film 105 and the gate conductive film 130. For example, as shown in FIG. 3, the gate dielectric film 120 may further extend along the upper surface of the field insulating film 105. In other embodiments, a part of the gate dielectric film 120 may be interposed between the gate conductive film 130 and the first gate cutting pattern CT1, and between the gate conductive film 130 and the second gate cutting pattern CT2. For example, as shown in FIG. 3, the gate dielectric film 120 may further extend along the side surfaces of the first gate cutting pattern CT1 and the side surfaces of the second gate cutting pattern CT2.

The gate dielectric film 120 may include, for example, at least one of silicon oxide, silicon oxynitride, silicon nitride, and a high dielectric constant (high-k) material having a higher dielectric constant than silicon oxide. The high dielectric constant material may include, but is not limited to, hafnium oxide.

The gate spacer 140 may be formed on the substrate 100 and the field insulating film 105. The gate spacer 140 may extend along both side surfaces of the gate conductive film 130. For example, the gate spacer 140 may extend in the second direction Y to intersect the active patterns F1 to F5.

The gate spacer 140 may include, but is not limited to, at least one of silicon oxide, silicon nitride, silicon oxynitride, and a combination thereof. A gate capping pattern 150 may extend along the upper surface of the gate conductive film 130. For example, the gate capping pattern 150 may extend in the second direction Y to cover the upper surface of the gate conductive film 130. This gate capping pattern 150 may include, but is not limited to, at least one of silicon oxide, silicon nitride, silicon oxynitride, and a combination thereof.

In some embodiments, a first dummy gate electrode DG1 may be formed on the first cell separation pattern IB1, and a second dummy gate electrode DG2 may be formed on the second cell separation pattern IB2. The first dummy gate electrode DG1 and the second dummy gate electrode DG2 may be dummy electrodes that do not function as gate electrodes. The first dummy gate electrode DG1 and the second dummy gate electrode DG2 may be formed at the same level as the gate electrodes G1 to G3. As used herein, the expression "formed at the same level" means that they may be formed by the same fabricating process. For example, each of the first dummy gate electrode DG1 and the second dummy gate electrode DG2 may include a gate conductive film 130, a gate dielectric film 120, a gate spacer 140, and a gate capping pattern 150.

A first source/drain region 160 may be formed on the first active region AR1. For example, the first source/drain region 160 may be formed inside the first active pattern F1 and the second active pattern F2 on both sides of the gate conductive film 130. The first source/drain region 160 may be spaced apart from the gate conductive film 130 by the gate spacer 140.

In some embodiments, the first source/drain region 160 may include an epitaxial layer formed inside the first active pattern F1 and the second active pattern F2. In some embodiments, the first active pattern F1 and the second active pattern F2 may share the first source/drain region 160. For example, the first source/drain region 160 may be a merged epitaxial layer.

When the semiconductor device is formed in the first active region AR1 is a PFET, the first source/drain region 160 may include p-type impurities or impurities for preventing diffusion of p-type impurities. For example, the first source/drain region 160 may include at least one of B, C, In, Ga, and Al or a combination thereof.

A second source/drain region 260 may be formed on the second active region AR2. For example, the second source/drain region 260 may be formed inside the third active pattern F3 and the fourth active pattern F4 on both sides of the gate conductive film 130. The second source/drain region 260 may be spaced apart from the gate conductive film 130 by the gate spacer 140.

In some embodiments, the second source/drain region 260 may include an epitaxial layer formed inside the third active pattern F3 and the fourth active pattern F4. In some embodiments, the third active pattern F3 and the fourth active pattern F4 may share a second source/drain region 260. For example, the second source/drain region 260 may be a merged epitaxial layer.

When the semiconductor device formed inside the second active region AR2 is an NFET, the second source/drain region 260 may include n-type impurities or impurities for preventing diffusion of n-type impurities. For example, the second source/drain region 260 may include at least one of P, Sb, As or a combination thereof.

A third source/drain region 360 may be formed on the third active region AR3. For example, the third source/drain region 360 may be formed inside the fifth active pattern F5 on both sides of the gate conductive film 130. The third source/drain region 360 may be spaced apart from the gate conductive film 130 by the gate spacer 140.

In some embodiments, the third source/drain region 360 may include an epitaxial layer formed inside the fifth active pattern F5. In some embodiments, the third source/drain region 360 may be a merged epitaxial layer.

When the semiconductor device formed inside the third active region AR3 is an NFET, the third source/drain region 360 may include n-type impurities or impurities for preventing the diffusion of n-type impurities. For example, the third source/drain region 360 may include at least one of P, Sb, As or a combination thereof.

Although each of the first source/drain region 160, the second source/drain region 260 and the third source/drain region 360 is shown as a single film, the technical idea of the present disclosure is not limited thereto. For example, the first source/drain region 160, the second source/drain region 260, and the third source/drain region 360 may be formed of multi-films each containing impurities having different concentrations from each other.

A plurality of interlayer insulating films 110, 210, 220, and 230 may be formed on the substrate 100. The interlayer insulating films 110, 210, 220, and 230 may be formed from at least one of silicon oxide, silicon oxynitride and a low dielectric constant (low-k) material having a lower dielectric constant than that of silicon oxide, for example.

The first interlayer insulating film 110 and the second interlayer insulating film 210 may be formed to cover the field insulating film 105, the first source/drain region 160, the second source/drain region 260, the third source drain region 360, the gate spacer 140 and the gate capping pattern 150. For example, the first interlayer insulating film 110 may be formed on the field insulating film 105 to cover the side surfaces of the gate spacer 140. The second interlayer insulating film 210 may be formed on the first interlayer insulating film 110 to cover the upper surface of the gate capping pattern 150.

The source/drain contacts CA11 to CA22 may be placed on both sides of the gate electrodes G1 to G3. Further, the source/drain contacts CA11 to CA22 may be connected to the first active region AR1, the second active region AR2 or the third active region AR3. For example, a first source/drain contact CA11, a second source/drain contact CA12, a third source/drain contact CA13, a fourth source/drain contact CA21 and a fifth source/drain contact CA22, which penetrate the first interlayer insulating film 110 and the second interlayer insulating film 210 and are connected to the first source/drain region 160, the second source/drain region 260 or the third source/drain region 360, may be formed.

The first source/drain contact CA11 may be placed on at least one side of the gate electrodes G1 to G3. For example, the first source/drain contact CA11 may be formed on the first active region AR1 and/or the second active region AR2 between the first cell separation pattern IB1 and the first gate electrode G1. The first source/drain contact CA11 may be formed inside the insulating films (e.g., the field insulating film 105 and the first interlayer insulating film 110) which covers the first active region AR1 and/or the second active region AR2, and may be connected to the first active region AR1 and/or the second active region AR2.

In some embodiments, the first source/drain contact CA11 may connect the first active region AR1 and the second active region AR2. For example, the first source/drain contact CA11 extends in the second direction Y over the first active region AR1, the intermediate region MR and the second active region AR2, and may connect the first source/drain region 160 and the second source/drain region 260.

The first source/drain contact CA11 may have a form that is recessed downward from the first source/drain region 160 and/or the second source/drain region 260 toward the upper surface of the substrate 100. For example, the first source/drain contact CA11 may include a first extension portion EP1 which extends in the second direction Y and connects the first source/drain region 160 and the second source/drain region 260. At this time, as shown in FIGS. 4, 5a and 5b, the lower surface of the first extension portion EP1 may be closer to the upper surface of the substrate 100 than an uppermost portion 160T of the first source/drain region 160.

The first source/drain contact CA11 may include a first recess portion RP1 that is further recessed from the first extension portion EP1 inside the intermediate region MR. For example, the insulating film (e.g., the first interlayer insulating film 110) placed inside the intermediate region MR may include a first recess 110r1 that is closer to the upper surface of the substrate 100 than the lower surface of the first extension portion EP1. The first recess portion RP1 may fill the first recess 110r1. That is, the first recess portion RP1 may be in a form that protrudes from the lower surface of the first extension portion EP1 placed in the intermediate region MR.

In some embodiments, the side surfaces of the first recess portion RP1 may be in contact with the side surfaces of the first source/drain region 160 and the side surfaces of the second source/drain region 260. For example, the first recess 110r1 may expose the side surfaces of the first source/drain region 160 and the side surfaces of the second source/drain region 260. In such a case, a contact area between the first source/drain contact CA11, the first source/drain region 160 and the second source/drain region 260 increases, and the electrical resistance may be improved.

In some embodiments, as shown in FIG. 5a, the lowermost surface of the first recess portion RP1 may be formed to be higher than the upper surface of the field insulating film 105 on the basis of the upper surface of the substrate 100. In some embodiments, as shown in FIG. 5b, the lowermost surface of the first recess portion RP1 may be formed to be lower than the upper surface of the field insulating film 105 on the basis of the upper surface of the substrate 100.

In some embodiments, the first source/drain contact CA11 may further include a first contact portion CP1. The first contact portion CP1 may be in a form that protrudes from the upper surface of the first extension portion EP1. The first source/drain contact CA11 may be in contact with at least a part of the routing wirings RW1 and RW2 to be described below through the first contact portion CP1.

The second source/drain contact CA12 may be placed on at least one side of the gate electrodes G1 to G3. For example, the second source/drain contact CA12 may be formed on the first active region AR1 between the first gate electrode G1 and the second gate electrode G2. The second source/drain contact CA12 is formed in the insulating films (e.g., the field insulating film 105 and the first interlayer insulating film 110) that cover the first active region AR1, and may be connected to the first active region AR1.

In some embodiments, the second source/drain contact CA12 may connect the first active region AR1 and the first power supply wiring $V_{DD}$. For example, a routing via VA which connects the second source/drain contact CA12 and the first power supply wiring $V_{DD}$ may be formed inside the third interlayer insulating film 220. The second source/drain contact CA12 extends in the second direction Y over the first power supply region PW1 and the first active region AR1, and may connect the first source/drain region 160 and the routing via VA.

The second source/drain contact CA12 may have a form that is recessed downward from the first source/drain region 160 toward the upper surface of the substrate 100. For example, the second source/drain contact CA12 may include a second extension portion EP2 that extends in the second direction Y and is connected to the first source/drain region 160. At this time, as shown in FIGS. 6 and 7, the lower surface of the second extension portion EP2 may be closer to the upper surface of the substrate 100 than the uppermost portion 160T of the first source/drain region 160.

The second source/drain contact CA12 may include a second recess portion RP2 that is further recessed from the second extension portion EP2 inside the first power supply region PW1. For example, the insulating film (e.g., the field insulating film 105 and the first interlayer insulating film 110) placed in the first power supply region PW1 may include a second recess 110r2 that is closer to the upper surface of the substrate 100 than the lower surface of the second extension portion EP2. The second recess portion RP2 may fill the second recess 110r2. That is, the second recess portion RP2 may be in the form that protrudes from the lower surface of the second extension portion EP2 placed inside the first power supply region PW1. In some embodiments, and as shown in FIG. 7, the lowermost surface of the second recess portion RP2 is formed to be lower than the upper surface of the field insulating film 105 on the basis of the upper surface of the substrate 100.

The first recess portion RP1 of the first source/drain contact CA11 may be formed to be shallower than the second recess portion RP2 of the second source/drain contact CA12. For example, as shown in FIGS. 5a, 5b and 7, a first depth D1 at which the first recess 110r1 is formed may be shallower than a second depth D2 at which the second recess 110r2 is formed, on the basis of the uppermost portion 160T of the first source/drain region 160. Accordingly, as shown in FIGS. 4 to 7, a first height H1 of the lowermost surface of the first recess portion RP1 may be higher than a second height H2 of the lowermost surface of the second recess portion RP2, on the basis of the upper surface of the substrate 100.

For example, the first depth D1 may be from about 10 nm to about 50 nm, and the second depth D2 may be from about 40 nm to about 80 nm. Preferably, the first depth D1 may be from about 20 nm to about 40 nm, and the second depth D2 may be from about 50 nm to about 70 nm.

In some embodiments, the side surface of the second recess portion RP2 may be in contact with the side surface of the first source/drain region 160. For example, the second recess 110r2 may expose the side surface of the first source/drain region 160. In such a case, the contact area between the second source/drain contact CA12 and the first source/drain region 160 may be increased to improve the electrical resistance. In other embodiments, the contact area between the second source/drain contact CA12 and the first source/drain region 160 may be greater than the contact area between the first source/drain contact CA11 and the first source/drain region 160. This may be because, as described above, the second recess portion RP2 of the second source/drain contact CA12 is formed to be deeper than the first recess portion RP1 of the first source/drain contact CA11.

In still further embodiments, the second source/drain contact CA12 may further include a second contact portion CP2. The second contact portion CP2t may be in the form that protrudes from the upper surface of the second extension portion EP2. The second source/drain contact CA12 may be in contact with the first power supply wiring $V_{DD}$ through the second contact portion CP2.

The third source/drain contact CA13 may be placed on at least one side of the gate electrodes G1 to G3. For example, a third source/drain contact CA13 may be formed on the second active region AR2 between the first gate electrode G1 and the second gate electrode G2. The third source/drain contact CA13 is formed inside the insulating films (for example, the field insulating film 105 and the first interlayer insulating film 110) which cover the second active region AR2, and may be connected to the second active region AR2.

In other embodiments, the third source/drain contact CA13 may connect the second active region AR2 to the second power supply wiring Vss. For example, a routing via VA which connects the third source/drain contact CA13 and the second power supply wiring Vss may be formed inside the third interlayer insulating film 220. The third source/drain contact CA13 extends in the second direction Y over the second power supply region PW2 and second active region AR2, and may connect the second source/drain region 260 and the routing via VA.

The third source/drain contact CA13 may have a form that is recessed downward from the second source/drain region 260 and towards the upper surface of the substrate 100. Since the shape of the third source/drain contact CA13 may be similar to the shape of the second source/drain contact CA12, detailed description thereof will not be provided below.

The fourth source/drain contact CA21 may be placed on at least one side of the gate electrodes G1 to G3. For example, the fourth source/drain contact CA21 may be formed on the third active region AR3 between the first cell separation pattern IB1 and the first gate electrode G1. The fourth source/drain contact CA21 is formed inside the insulating film (for example, the field insulating film 105 and the first interlayer insulating film 110) which covers the third active region AR3, and may be connected to the third active region AR3.

The fifth source/drain contact CA22 may be placed on at least one side of the gate electrodes G1 to G3. For example, a fifth source/drain contact CA22 may be formed on the third active region AR3 between the first gate electrode G1 and the second gate electrode G2. The fifth source/drain contact CA22 is formed inside the insulating films (for example, the field insulating film 105 and the first interlayer insulating film 110) which cover the third active region AR3, and may be connected to the third active region AR3.

The gate contacts CB may be placed to correspond to the respective gate electrodes G1 to G3. Further, the gate contacts CB may be connected to each of the gate electrodes G1 to G3. For example, as shown in FIG. 3, each gate contact CB sequentially penetrates the second interlayer insulating film 210, the first interlayer insulating film 110, and the gate capping pattern 150, and may be connected to the gate conductive film 130.

The routing wirings RW1 and RW2 may be placed inside the first cell region CR1. The routing wirings RW1 and RW2 may be spaced apart from each other and extend side by side in the first direction X. In some embodiments, the routing wirings RW1 and RW2 may be placed at the same level as the first power supply wiring $V_{DD}$ and the second power supply wiring Vss. For example, the first power supply wiring $V_{DD}$, the second power supply wiring Vss, and the routing wirings RW1 and RW2 may be placed inside the fourth interlayer insulating film 230.

The gate contact CB may connect at least some of the respective gate electrodes G1 to G3 and the routing wirings RW1 and RW2. For example, as shown in FIG. 3, the gate contact CB penetrates the second interlayer insulating film 210, the first interlayer insulating film 110 and the gate capping pattern 150, and may connect the gate conductive film 130 and the first routing wiring RW1.

The first source/drain contact CA11 may connect the first active region AR1 and/or the second active region AR2 and at least a part of the routing wirings RW1 and RW2. For example, as shown in FIG. 4, a routing via VA which connects the first source/drain contact CA11 and the second routing wiring RW2 may be formed inside the third interlayer insulating film 220. The first source/drain contact CA11 may connect the first source/drain region 160 and/or the second source/drain region 260 and the second routing wiring RW2 through the routing via VA. In some embodiments, the routing via VA may be in contact with the first contact portion CP1 of the first source/drain contact CA11.

In some embodiments, each of the source/drain contacts CA11 to CA22, the gate contacts CB, the routing vias VA, the routing wirings RW1 and RW2, the first power supply wiring $V_{DD}$ and the second power supply wiring Vss may include barrier films 212, 216 and 222 and filling films 214, 218 and 224. As shown, these barrier films 212, 216 and 222 may be interposed between the interlayer insulating films 110, 210, 220 and 230 and the filling films 214, 218 and 224. The barrier films 212, 216 and 222 may include a metal or metal nitride for preventing diffusion of the filling films 214, 218 and 224. For example, the barrier films 212, 216, 222 may include, but are not limited to, at least one of titanium (Ti), tantalum (Ta), tungsten (W), nickel (Ni), cobalt (Co), platinum (Pt), alloys and nitrides thereof.

The filling films 214, 218 and 224 may fill a space inside the interlayer insulating films 110, 210, 220 and 230 that remain after the barrier films 212, 216 and 222 are formed. The filling films 214, 218 and 224 may include, but are not limited to, at least one of aluminum (Al), copper (Cu), tungsten (W), molybdenum (Mo), cobalt (Co) and alloys thereof.

Although only a case in which the routing vias VA, the routing wirings RW1 and RW2, the first power supply wiring $V_{DD}$ and the second power supply wiring Vss are formed by a dual damascene process is shown, this is merely an example, and they may of course be formed by a single damascene process or other wiring process.

As the semiconductor devices become gradually highly integrated, performance degradation due to a parasitic capacitance becomes gradually serious. For example, the parasitic capacitance between the source/drain contact and the gate electrode becomes a cause of deteriorating the alternating current (AC) performance of the semiconductor device. In particular, because the source/drain contact may be further recessed in a region (e.g., the intermediate region MR) in which the source/drain region (or an epitaxial layer) is not formed, there is a problem that the parasitic capacitance between the source/drain contact and the gate electrode becomes more severe.

However, the semiconductor device according to some embodiments may include a first source/drain contact CA11 which is formed to be relatively shallow, even though a part thereof is placed in the intermediate region MR. Specifically, as described above, the first source/drain contact CA11 may include a first recess portion RP1 formed to be relatively shallower than the second recess portion RP2 of the second source/drain contact CA12. Accordingly, since the parasitic capacitance generated between the first source/drain contact CA11 and the adjacent gate electrode (e.g., the first gate electrode G1) is reduced, a semiconductor device with improved performance may be provided.

Further, the semiconductor device according to some embodiments may include a second source/drain contact CA12 (or a third source/drain contact CA13) formed to be relatively deeper in the first power supply region PW1 (or the second power supply region PW2). Specifically, as described above, the second source/drain contact CA12 may include a second recess portion RP2 formed to be relatively deeper than the first recess portion RP1 of the first source/drain contact CA11. Accordingly, an electrical resistance between the second source/drain contact CA12 (or the third source/drain contact CA13) which is provided with the power supply voltage and the first source/drain region 160 (or the second source/drain region 260) is improved, and a semiconductor device with improved performance may be provided.

Figure 8:
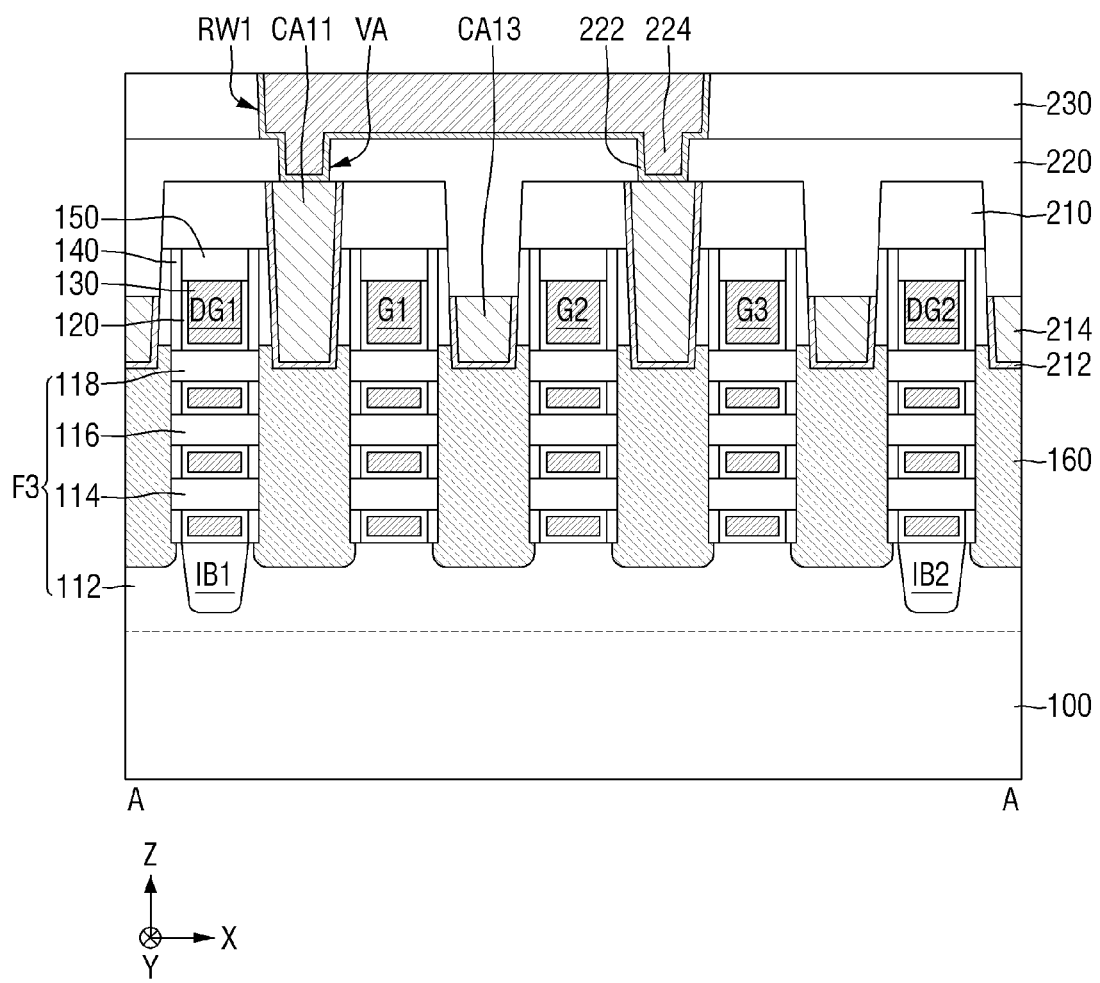
FIGS. 8 and 9 are cross-sectional views for explaining the semiconductor device according to some embodiments.
Figure 9:
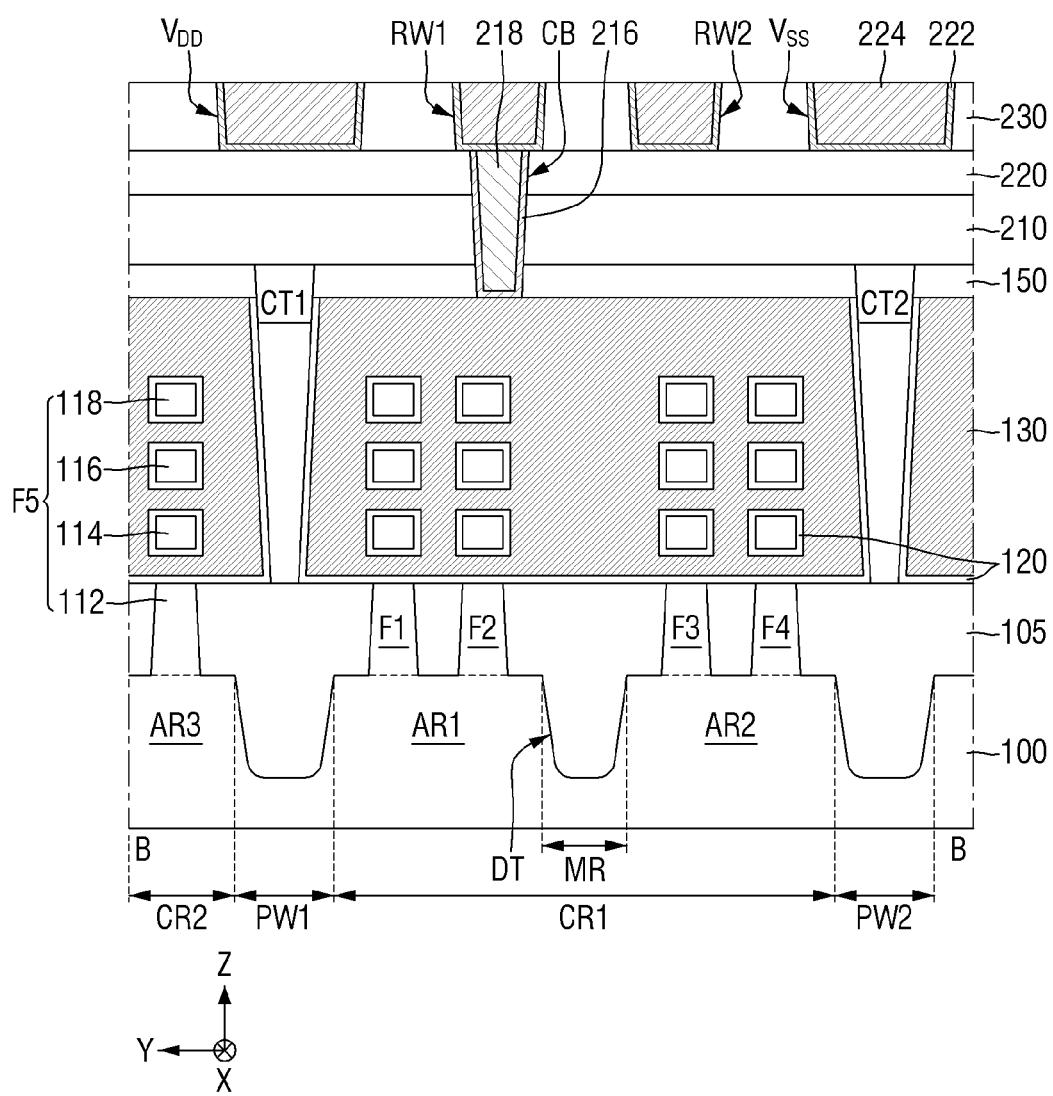

FIGS. 8 and 9 are cross-sectional views for explaining the semiconductor device according to some embodiments. For reference, FIG. 8 is another cross-sectional view taken along line A-A of FIG. 1, and FIG. 9 is another cross-sectional view taken along line B-B of FIG. 1. For convenience of explanation, repeated parts of contents explained above using FIGS. 1 to 7 will be briefly described or omitted.

Referring to FIGS. 8 and 9, in the semiconductor device according to some embodiments, each of the active patterns F1 to F5 include a plurality of wire patterns 114, 116, and 118. For example, each of the active patterns F1 to F5 may include first to third wire patterns 114, 116 and 118 that are sequentially stacked on the upper surface of the substrate 100 and spaced apart from each other. As an example, the first wire pattern 114 may be spaced part from the substrate 100 in the third direction Z, the second wiring pattern 116 may be spaced apart from the first wire pattern 114 in the third direction Z, and the third wire pattern 118 may be spaced apart from the second wiring pattern 116 in the third direction Z.

Each of the first to third wire patterns 114, 116 and 118 may extend in the first direction X. Further, each of the first to third wire patterns 114, 116 and 118 may penetrate the gate electrodes G1 to G3. Accordingly, as shown in FIG. 9, the gate electrodes G1 to G3 may have a shape that surrounds outer peripheral surfaces of the first to third wire patterns 114, 116 and 118. Although each of the cross-sections of the first to third wire patterns 114, 116, 118 is shown as a rectangular shape in FIG. 9, this is merely an example. For example, the cross-sections of the first to third wire patterns 114, 116 and 118 may be configured as other-shaped polygons or circles, for example. In some embodiments, unlike the shown case, the widths of the first to third wire patterns 114, 116 and 118 may also decrease as they go away from the upper surface of the substrate 100.

In some embodiments, each of the active patterns F1 to F5 may further include a fin-type pattern 112 that protrudes from the upper surface of the substrate 100 and extends in the first direction X. The first wire pattern 114 may be spaced apart from, for example, the fin-type pattern 112 in the third direction Z. Although only a fin-type transistor (FinFET) including a channel region of the fin-type pattern and a transistor including a channel region of a wire pattern (nanowire or nanosheet) have been described as the semiconductor device according to some embodiments, these are merely examples. As another example, the semiconductor device according to some embodiments may, of course, include a tunneling transistor (tunneling FET), a VFET (Vertical FET), a CFET (Complementary FET) or a three-dimensional (3D) transistor. Alternatively, the semiconductor device according to some embodiments may also include a bipolar junction transistor, a laterally-diffused metal-oxide semiconductor (LDMOS), and the like.

Figure 10:
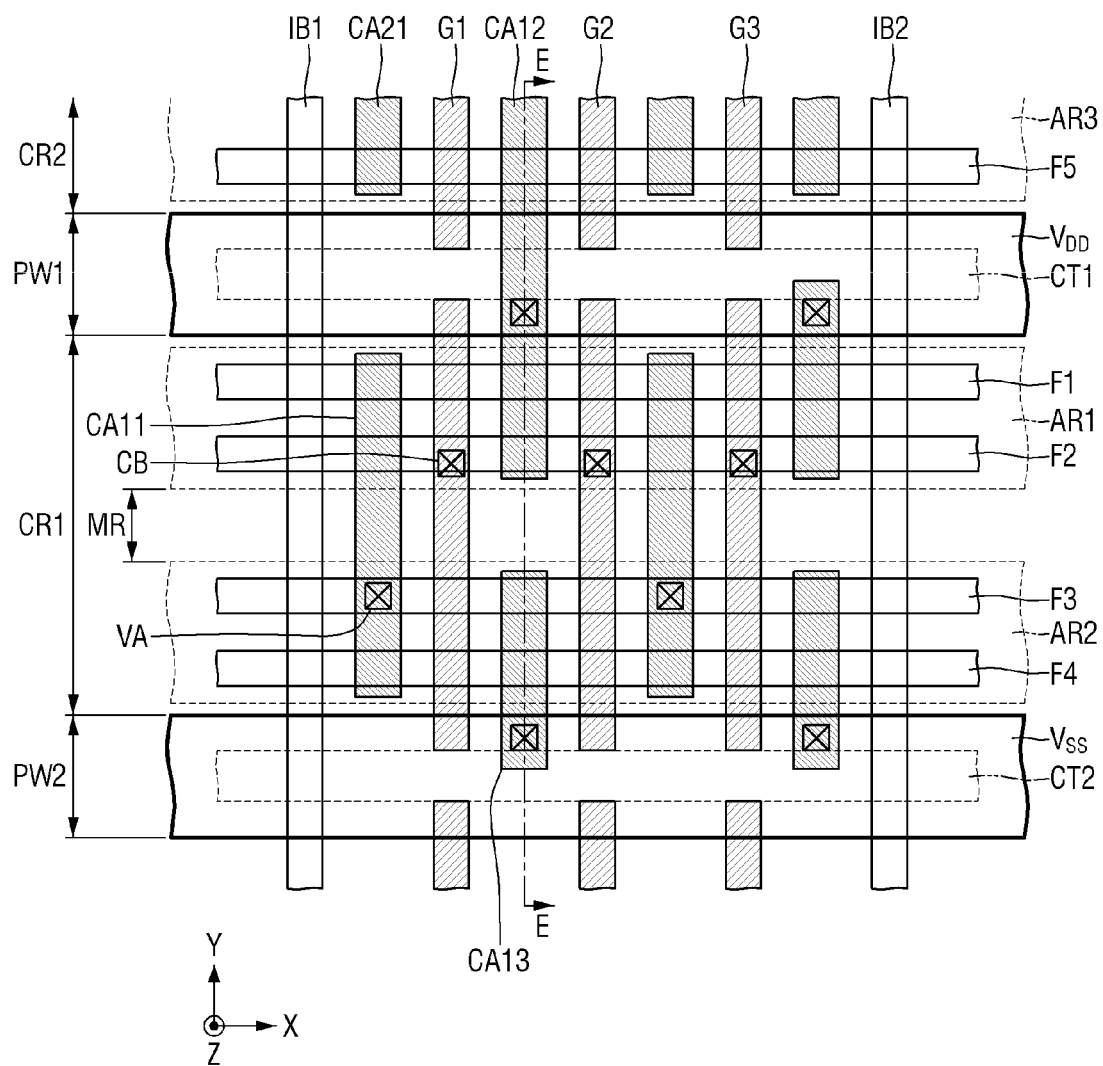
FIG. 10 is a schematic layout diagram for explaining a semiconductor device according to some embodiments.
Figure 11:
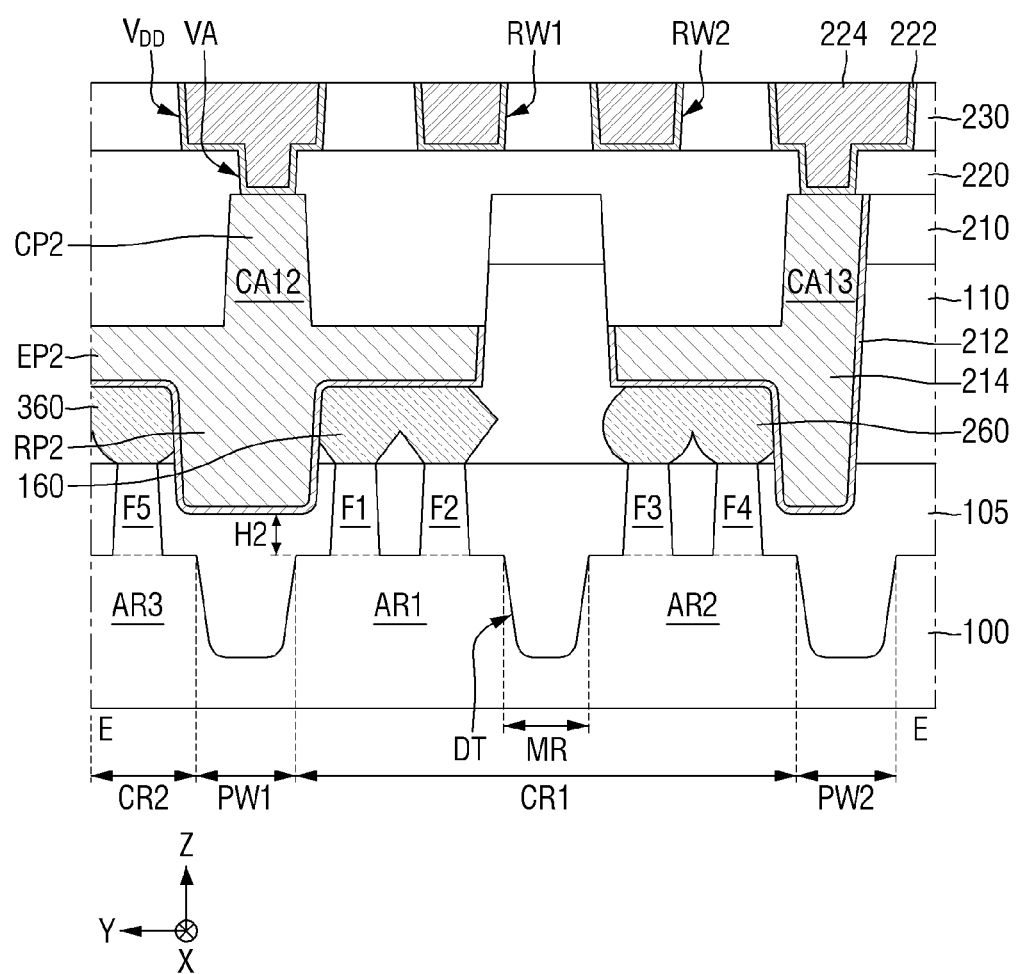
FIG. 11 is a cross-sectional view taken along line E-E of FIG. 10.

FIG. 10 is a schematic layout diagram for explaining a semiconductor device according to some embodiments. FIG. 11 is a cross-sectional view taken along line E-E of FIG. 10. For convenience of explanation, repeated parts of contents explained above using FIGS. 1 to 9 will be briefly described or omitted.

Referring to FIGS. 10 and 11, in the semiconductor device according to some embodiments, the second source/drain contact CA12 connects the first active region AR1 and the third active region AR3. For example, the second source/drain contact CA12 extends in the second direction Y over the first active region AR1, the first power supply region PW1 and the third active region AR3, and may connect the first source/drain region 160 and the third source/drain region 360.

In some embodiments, the side surface of the second recess portion RP2 may be in contact with the side surface of the third source/drain region 360. In such a case, a contact area between the second source/drain contact CA12 and the third source/drain region 360 may increase to improve the electrical resistance.

In some embodiments, the contact area between the second source/drain contact CA12 and the third source/drain region 360 may be greater than the contact area between the first source/drain contact (CA11 of FIG. 4) and the first source drain region 160. This is because, as described above, the second recess portion RP2 of the second source/drain contact CA12 is formed to be deeper than the first recess portion RP1 of the first source/drain contact CA11.

Figure 12:
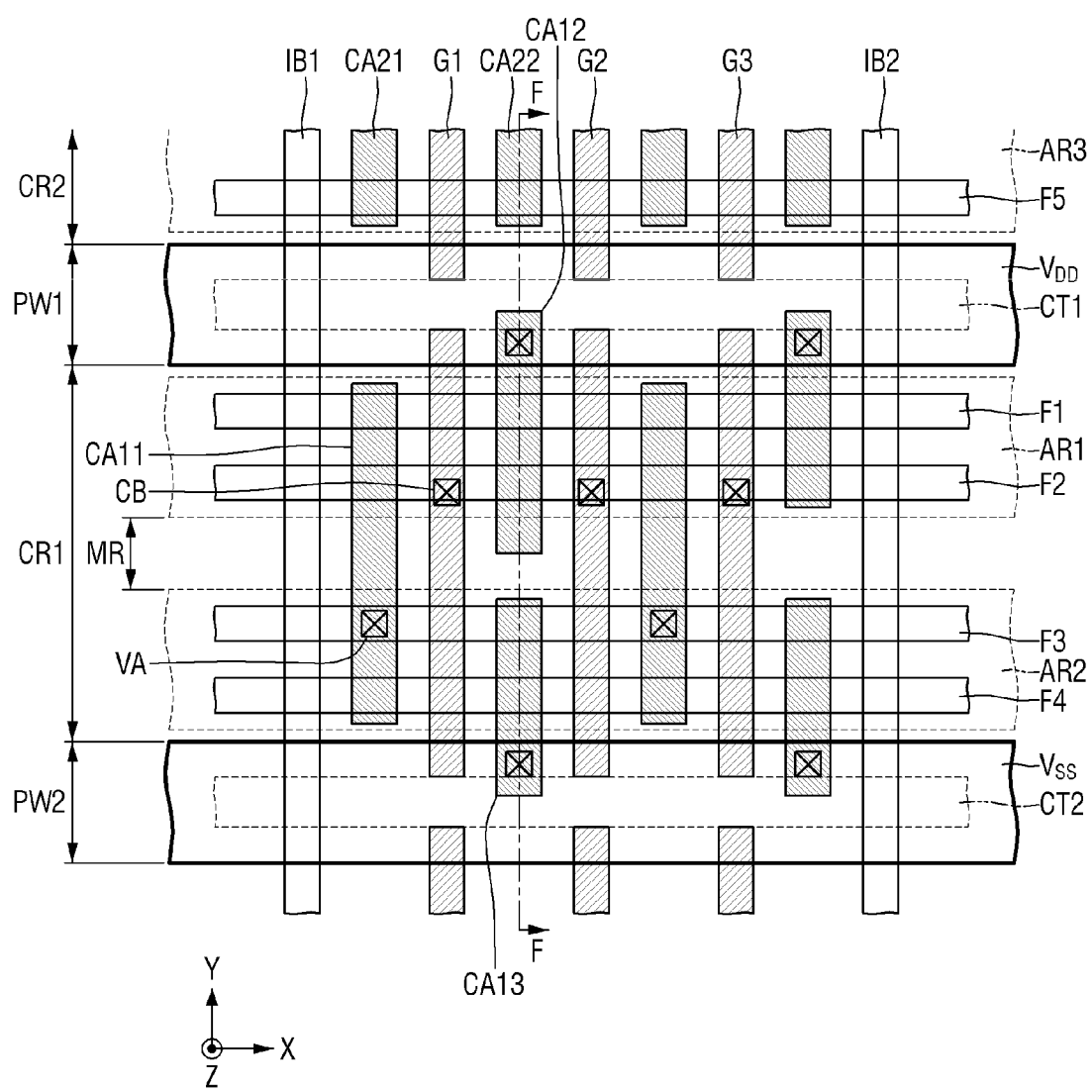
FIG. 12 is a schematic layout diagram for explaining a semiconductor device according to some embodiments.
Figure 13:
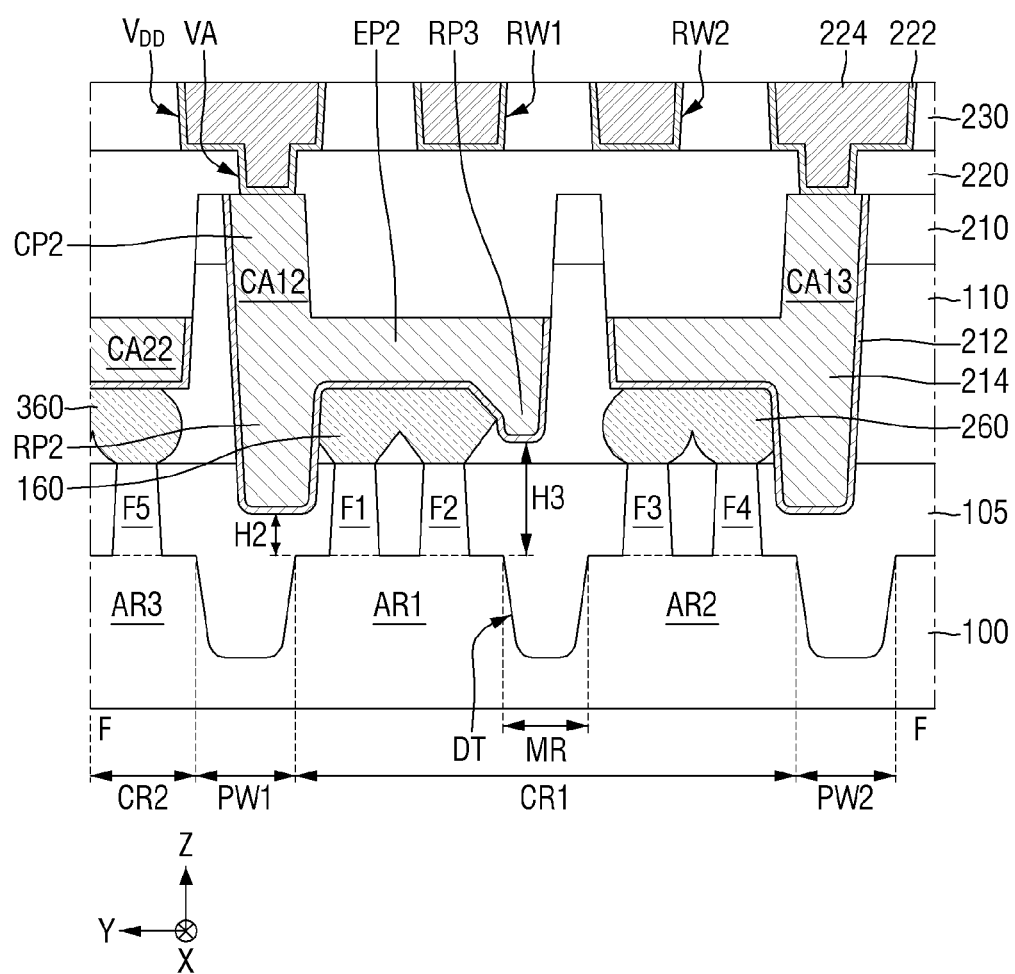
FIG. 13 is a cross-sectional view taken along line F-F of FIG. 12.

FIG. 12 is a schematic layout diagram for explaining a semiconductor device according to some embodiments. FIG. 13 is a cross-sectional view taken along line F-F of FIG. 12. For convenience of explanation, repeated parts of contents explained above using FIGS. 1 to 9 will be briefly described or omitted.

Referring to FIGS. 12 and 13, in the semiconductor device according to some embodiments, a part of the second source/drain contact CA12 is placed in the intermediate region MR. For example, the second source/drain contact CA12 may extend in the second direction Y over the first power supply region PW1, the first active region AR1 and the intermediate region MR. The second source/drain contact CA12 may include a third recess portion RP3 that is further recessed from the second extension portion EP2 in the intermediate region MR. For example, the third recess portion RP3 may be in the form that protrudes from the lower surface of the second extension portion EP2 placed in the intermediate region MR.

In some embodiments, the side surface of the third recess portion RP3 may be in contact with the side surface of the first source/drain region 160. In such a case, the contact area between the second source/drain contact CA12 and the first source/drain region 160 may increase to improve the electrical resistance.

The third recess portion RP3 of the second source/drain contact CA12 may be formed to be shallower than the second recess portion RP2 of the second source/drain contact CA12. For example, a third height H3 of the lowermost surface of the third recess portion RP3 may be higher than a second height H2 of the lowermost surface of the second recess portion RP2, on the basis of the upper surface of the substrate 100. In some embodiments, the third height H3 of the lowermost surface of the third recess portion RP3 may be the same as the first height (H1 of FIG. 4) of the lowermost surface of the first recess portion RP1, on the basis of the upper surface of the substrate 100. As used herein, the term "same" means not only exactly the same thing, but also includes minute differences that may occur due to process margins and the like.

Figure 14:
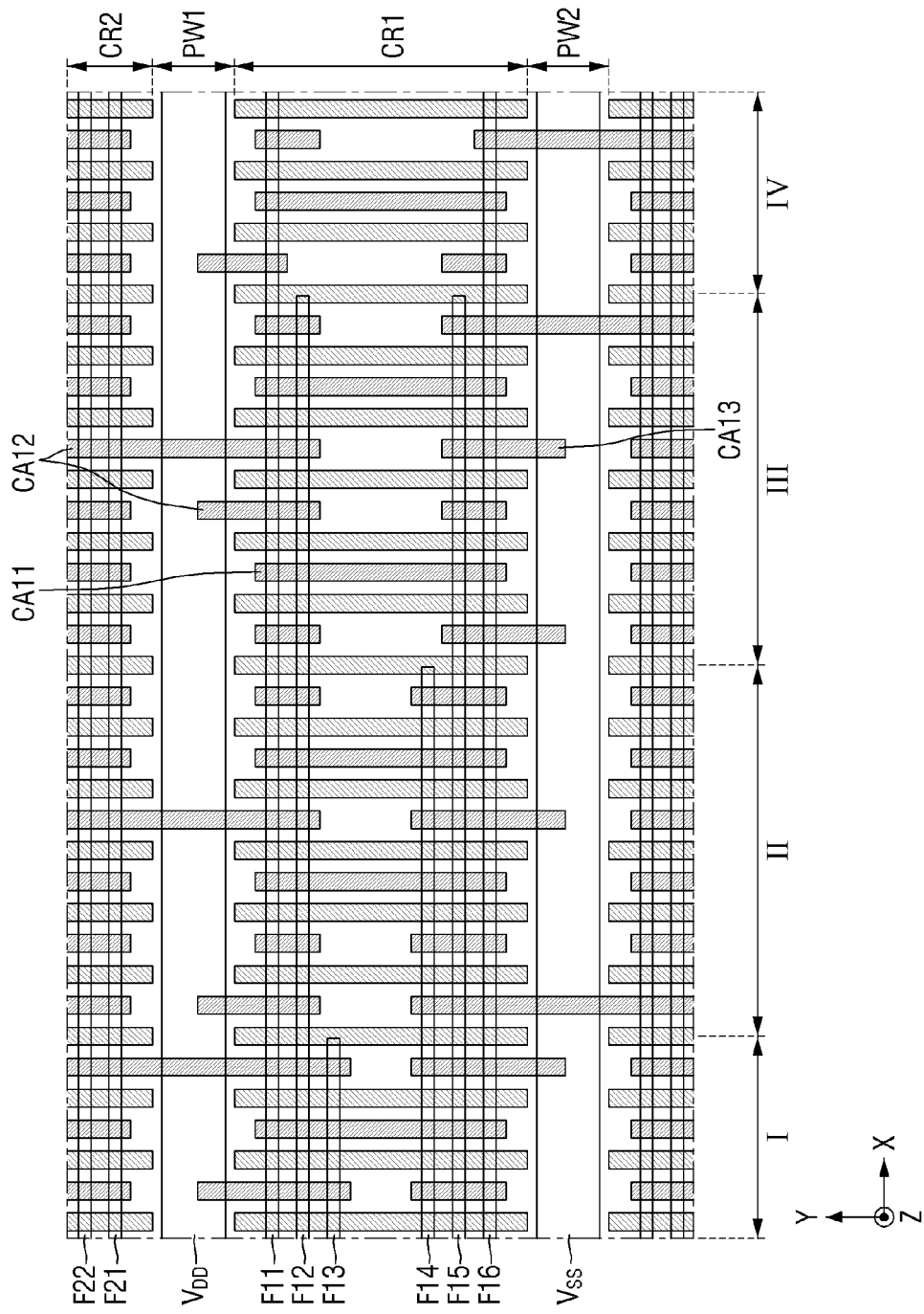
FIG. 14 is a schematic layout diagram for explaining a semiconductor device according to some embodiments.
Figure 15:
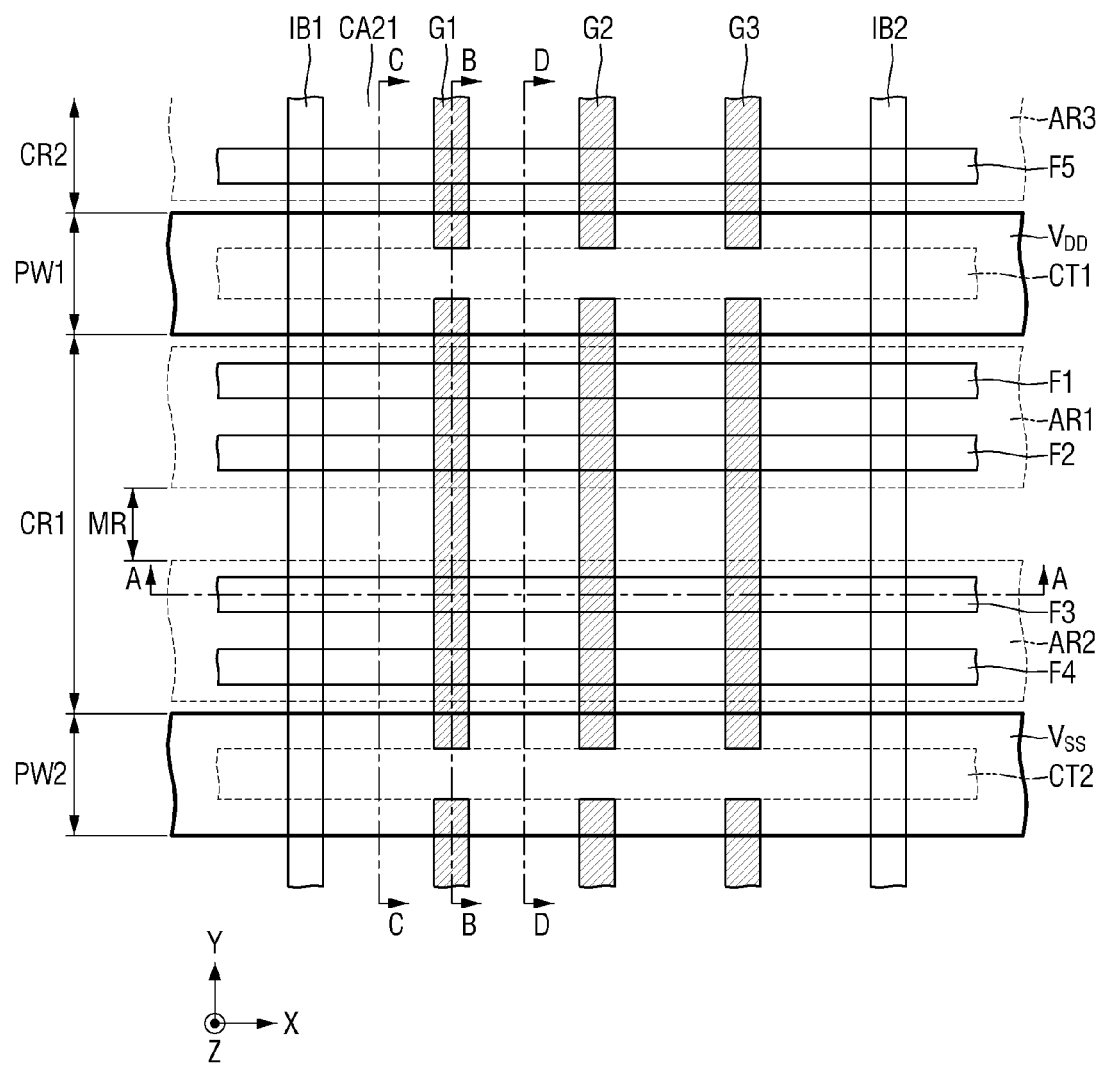
FIGS. 15 to 34 are cross-sectional views of intermediate structures that illustrate methods for fabricating the semiconductor devices according to some embodiments.
Figure 16:
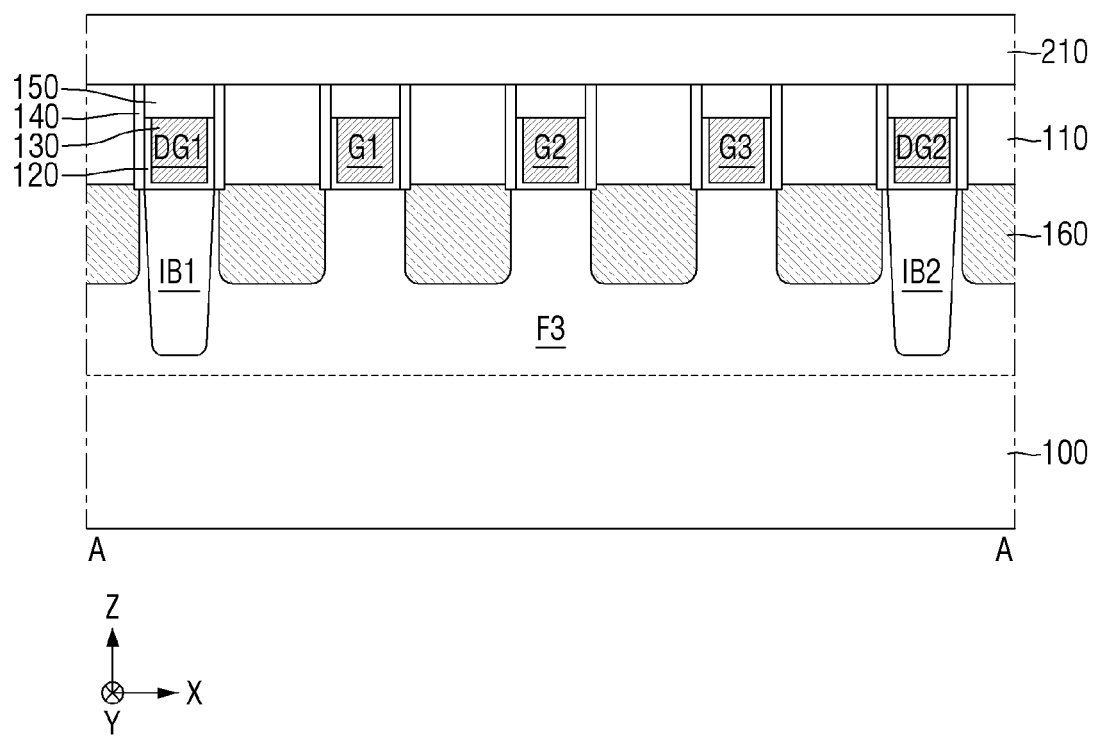
Figure 17:
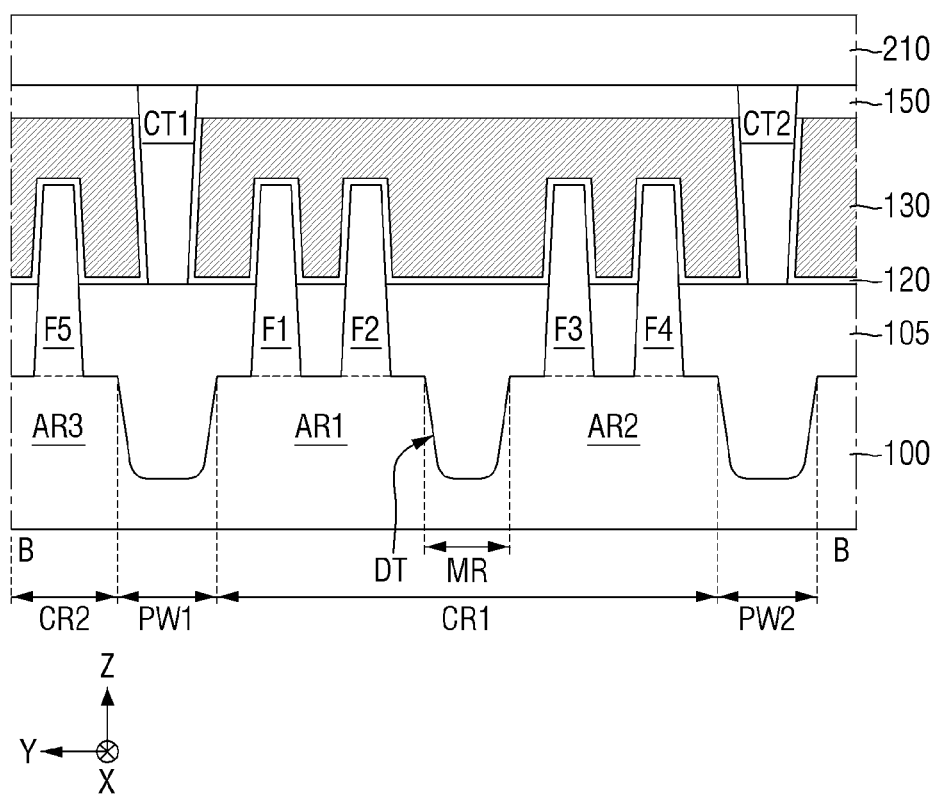
Figure 18:
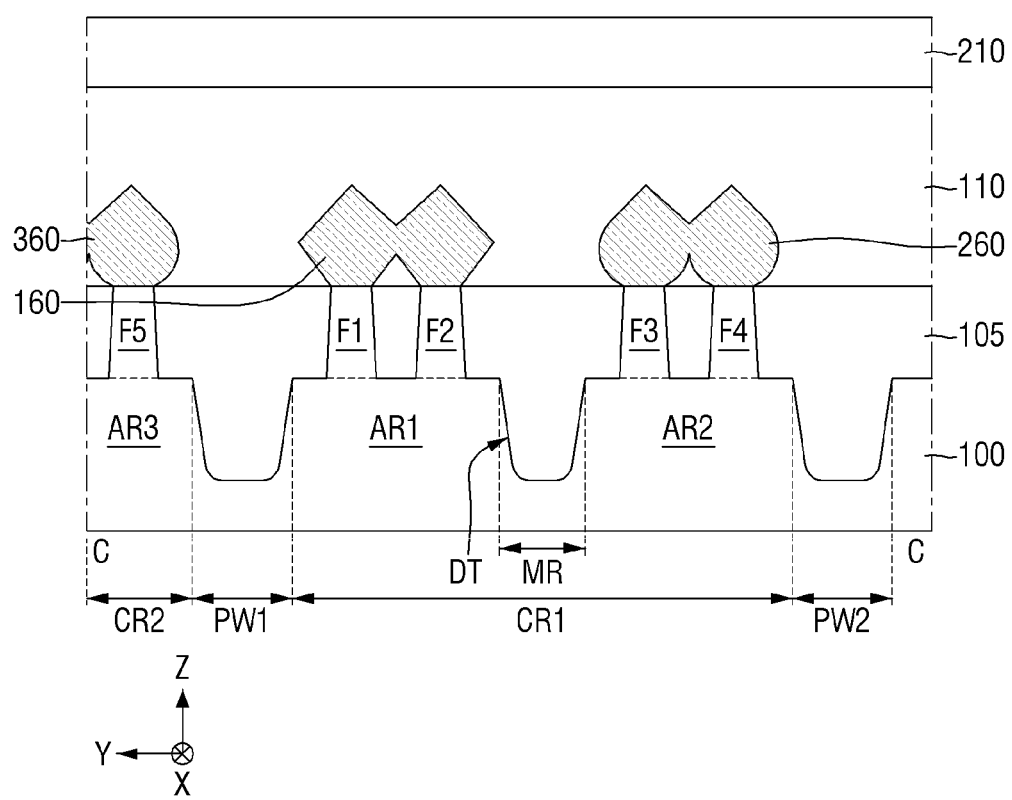
Figure 19:
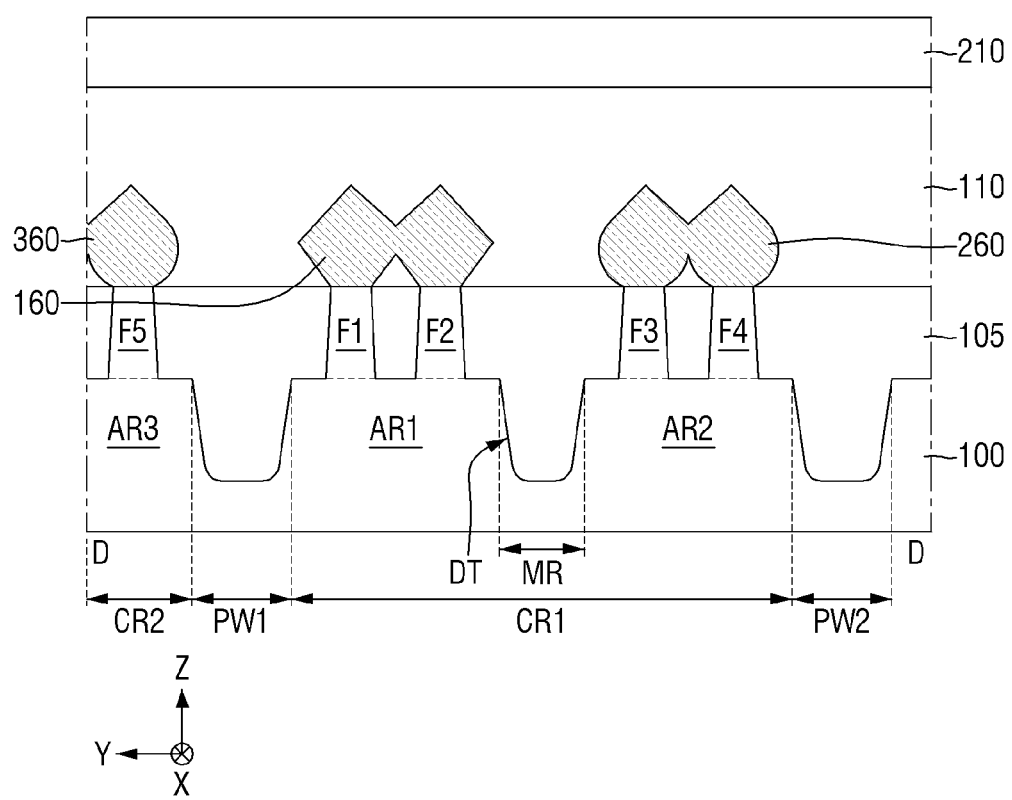

FIG. 14 is a schematic layout diagram for explaining a semiconductor device according to some embodiments. For convenience of explanation, repeated parts of contents explained above using FIGS. 1 to 13 will be briefly described or omitted. Referring to FIG. 14, in the semiconductor device according to some embodiments, the first cell region CR1 includes first active pattern groups F11 to F13 and second active pattern groups F14 to F16, and the second cell region CR2 includes third active pattern group F21 and F22. The first active pattern groups F11 to F13, the second active pattern groups F14 to F16, and the third active pattern groups F21 and F22 are spaced apart from each other, and may extend side by side in the first direction X The first source/drain contact CA11 may connect the first active pattern groups F11 to F13 and the second active pattern groups F14 to F16. The second source/drain contact CA12 may connect the first active pattern groups F11 to F13 and the first power supply wiring $V_{DD}$. The third source/drain contact CA13 may connect the second active pattern groups F14 to F16 and the second power supply wiring Vss.

In some embodiments, at least a part of the second source/drain contact CA12 may connect the first active pattern groups F11 to F13 and the third active pattern groups F21 and F22. In some embodiments, at least a part of the third source/drain contact CA13 may connect the second active pattern groups F14 to F16 and the third active pattern groups F21 and F22.

In some embodiments, semiconductor elements (e.g., transistors) of different conductive types from each other may also be formed on the first active pattern groups F11 to F13 and the second active pattern groups F14 to F16. Further, in some embodiments, semiconductor elements (for example, transistors) of different conductive types from each other may be formed on the first active pattern groups F11 to F13 and the third active pattern groups F21 and F22. In some embodiments, first to fourth regions I to IV arranged along the first direction X may be defined inside the first cell region CR1. In the first to fourth regions I to IV, the first cell region CR1 may have active patterns of different numbers from each other.

As an example, as shown, the first active pattern groups F11 to F13 may include a sixth active pattern F11 extending over the first to fourth regions I to IV, a seventh active pattern F12 extending over the first to third regions I to III, and an eighth active pattern F13 extending inside the first region I. Also, as an example, as shown, the second active pattern groups F14 to F16 may include a ninth active pattern F14 extending over the first and second regions I and II, a tenth active pattern F15 extending over the first to third regions I to III, and an eleventh active pattern F16 extending over the first to fourth regions I to IV.

Hereinafter, a method for fabricating a semiconductor device according to exemplary embodiments will be described referring to FIGS. 1 to 35. FIGS. 15 to 34 are intermediate stage diagrams for explaining the method for fabricating the semiconductor device according to some embodiments. For convenience of explanation, repeated parts of contents explained above using FIGS. 1 to 7 will be briefly described or omitted.

Referring to FIGS. 15 to 19, active patterns F1 to F5 and gate electrodes G1 to G3 are formed on the substrate 100. For example, a substrate 100 including a first power supply region PW1, a second power supply region PW2, a first cell region CR1 and a second cell region CR2 may be provided. The active patterns F1 to F5 may be formed on the substrate 100. In some embodiments, a substrate trench DT which defines the first active region AR1, the second active region AR2 and the third active region AR3 may be formed inside the substrate 100.

Subsequently, the field insulating film 105 may be formed on the substrate 100. The field insulating film 105 may be formed to surround at least a part of the side surfaces of the active patterns F1 to F5. Thereafter, gate electrodes G1 to G3 may be formed on the active patterns F1 to F5 and the field insulating film 105. The gate electrodes G1 to G3 may include a gate conductive film 130, a gate dielectric film 120, a gate spacer 140, and a gate capping pattern 150, respectively. The gate conductive film 130 may be formed, but is not limited to, using a replacement process.

Then, first to third source/drain regions 160, 260 and 360 may be formed on the active patterns F1 to F5. The first to third source/drain regions 160, 260 and 360 may be formed inside the active patterns F1 to F5 on either side of the gate electrodes G1 to G3. Next, the first interlayer insulating film 110 and the second interlayer insulating film 210 that cover the field insulating film 105, the first to third source/drain regions 160, 260 and 360, and the gate electrodes G1 to G3 may be formed.

In some embodiments, a first gate cutting pattern CT1 and a second gate cutting pattern CT2 that cut the gate electrodes G1 to G3 may be formed. Although the first gate cutting pattern CT1 and the second gate cutting pattern CT2 may be formed, for example, before the replacement process is performed, the embodiment is not limited thereto.

Figure 20:
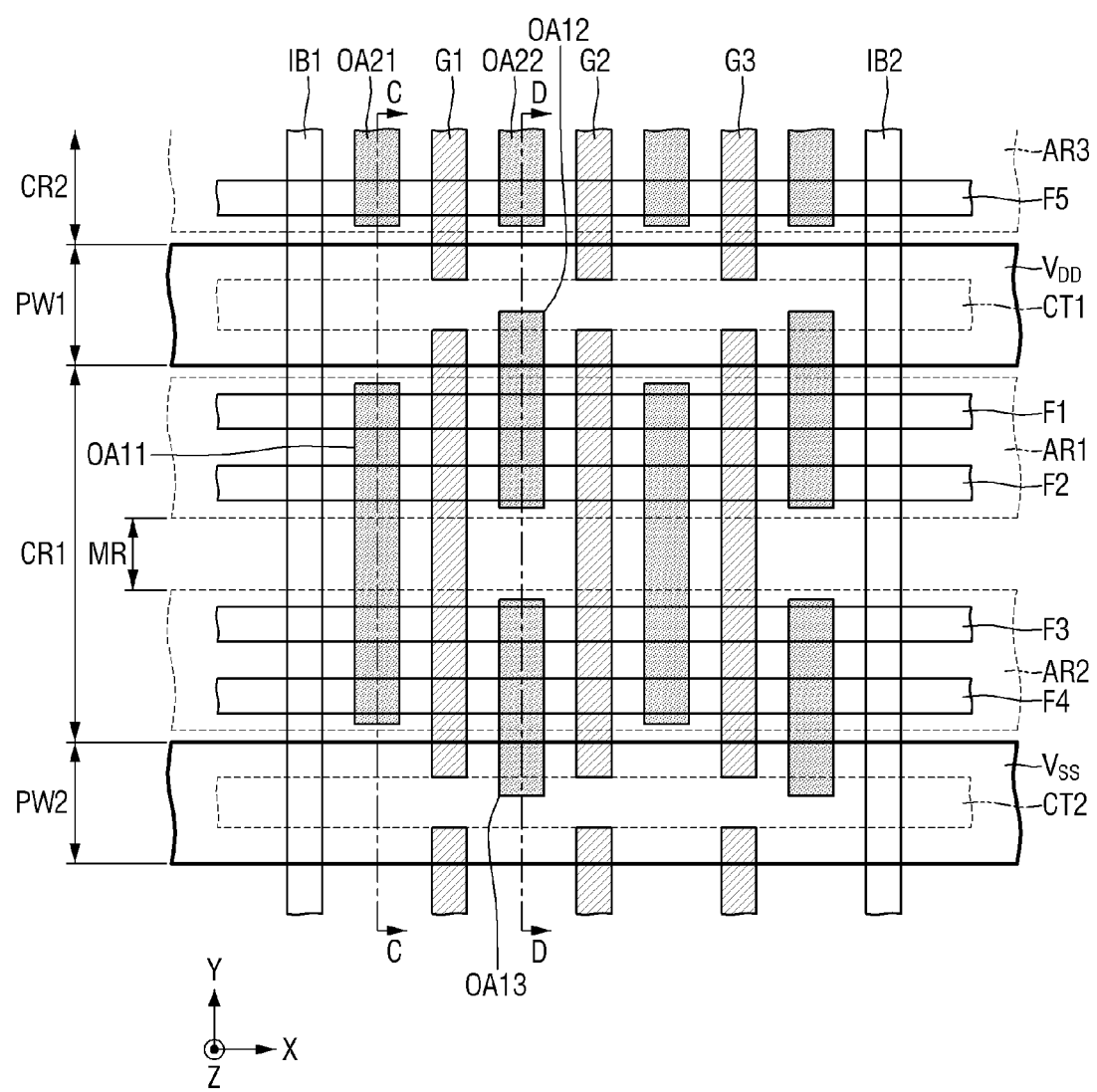
Figure 21:
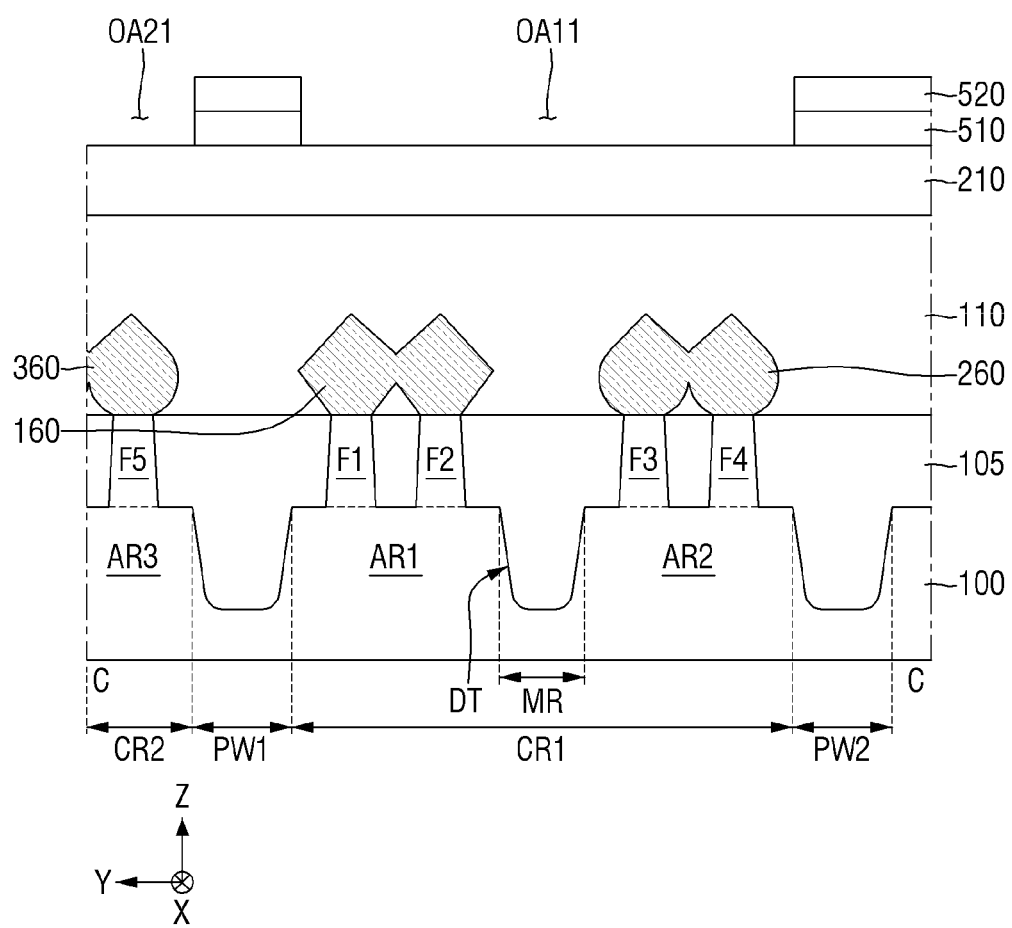
Figure 22:
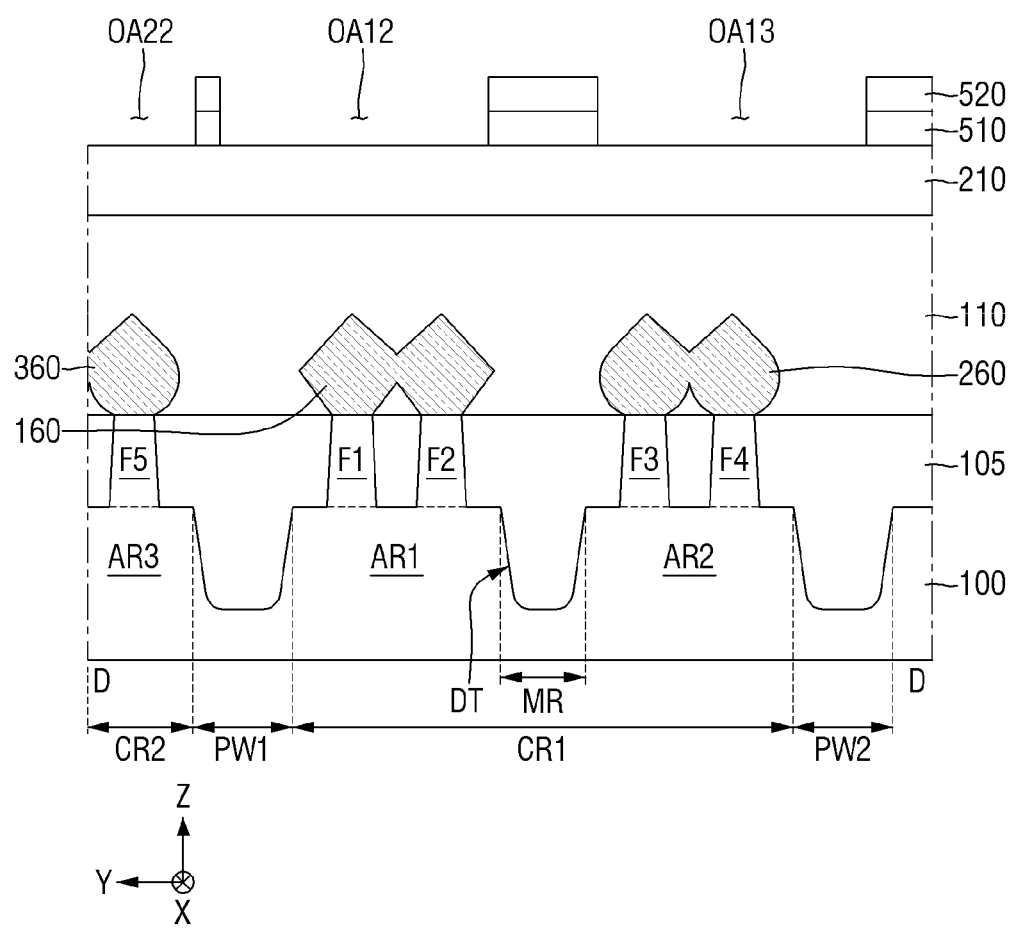

Referring to FIGS. 20 to 22, a first mask pattern 510 and a second mask pattern 520 are formed on the second interlayer insulating film 210. The second mask pattern 520 may include source/drain contact openings OA11 to OA22. Each of the source/drain contact openings OA11 to OA22 may correspond to the source/drain contacts CA11 to CA22 of FIGS. 1 to 7. For example, a first source/drain contact opening OA11, a second source/drain contact opening OA12, a third source/drain contact opening OA13, a fourth source/drain contact opening OA21 and a fifth source/drain contact opening OA22 which overlap the first source/drain region 160, the second source/drain region 260 or the third source/drain region 360 may be formed. The second mask pattern 520 may include, but is not limited to, a photoresist.

The first mask pattern 510 may be patterned by the second mask pattern 520. The first mask pattern 510 may have an etching selectivity with the first interlayer insulating film 110 and the second interlayer insulating film 210 that cover the first to third source/drain regions 160, 260 and 360.

Accordingly, the first mask pattern 510 may function as an etching mask in the process of etching the first interlayer insulating film 110 and the second interlayer insulating film 210 to expose the first to third source/drain regions 160, 260 and 360. The first mask pattern 510 may include, but is not limited to, a hard mask.

Figure 23:
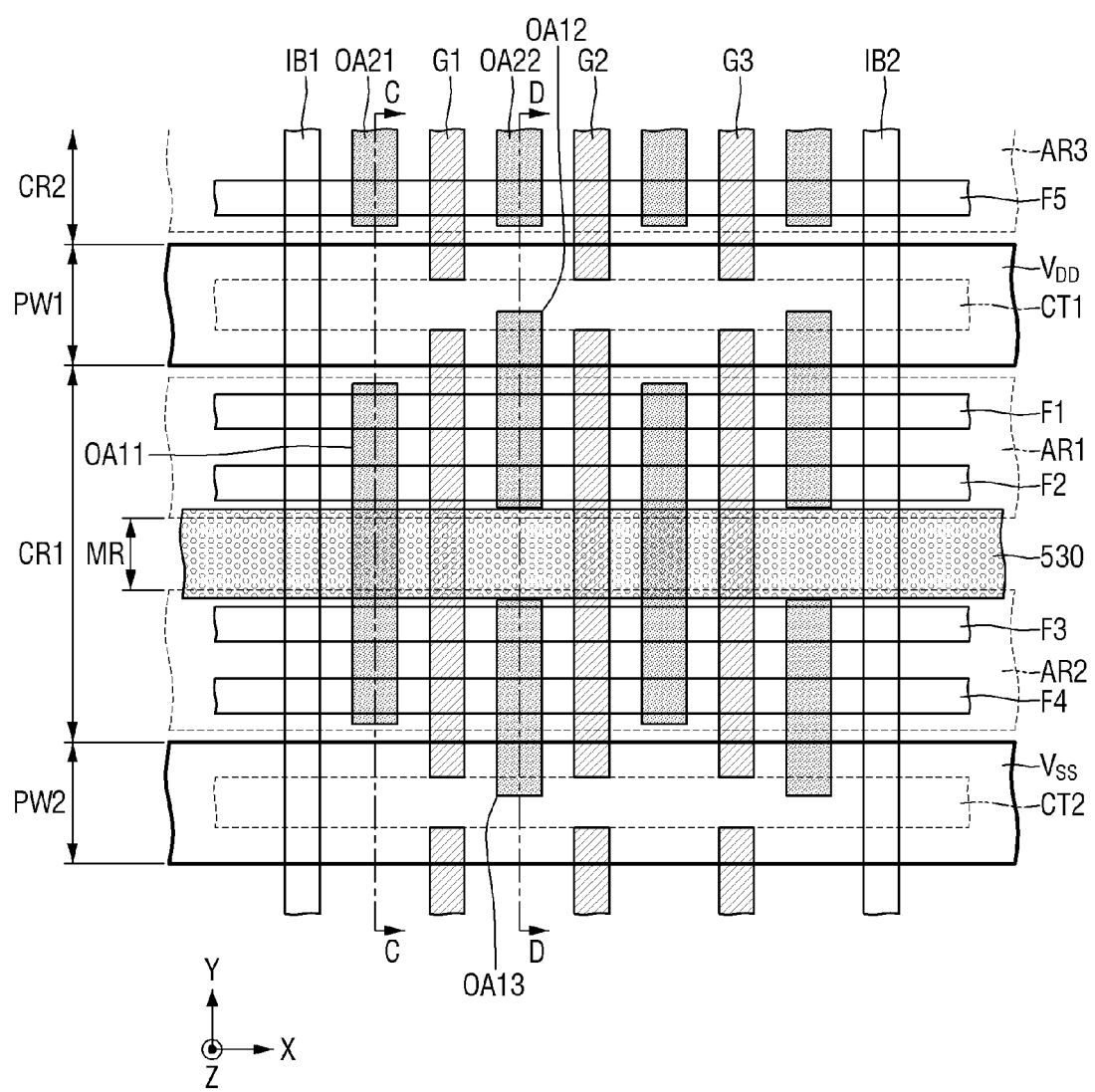
Figure 24:
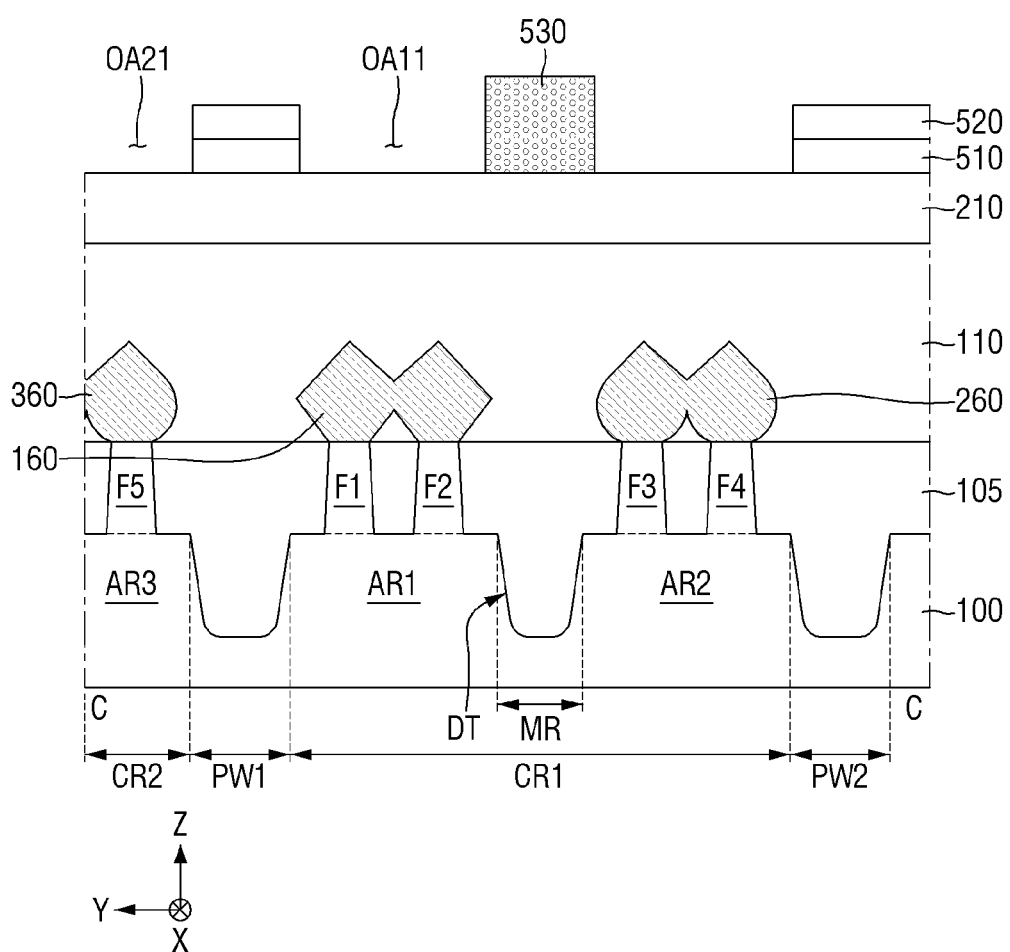
Figure 25:
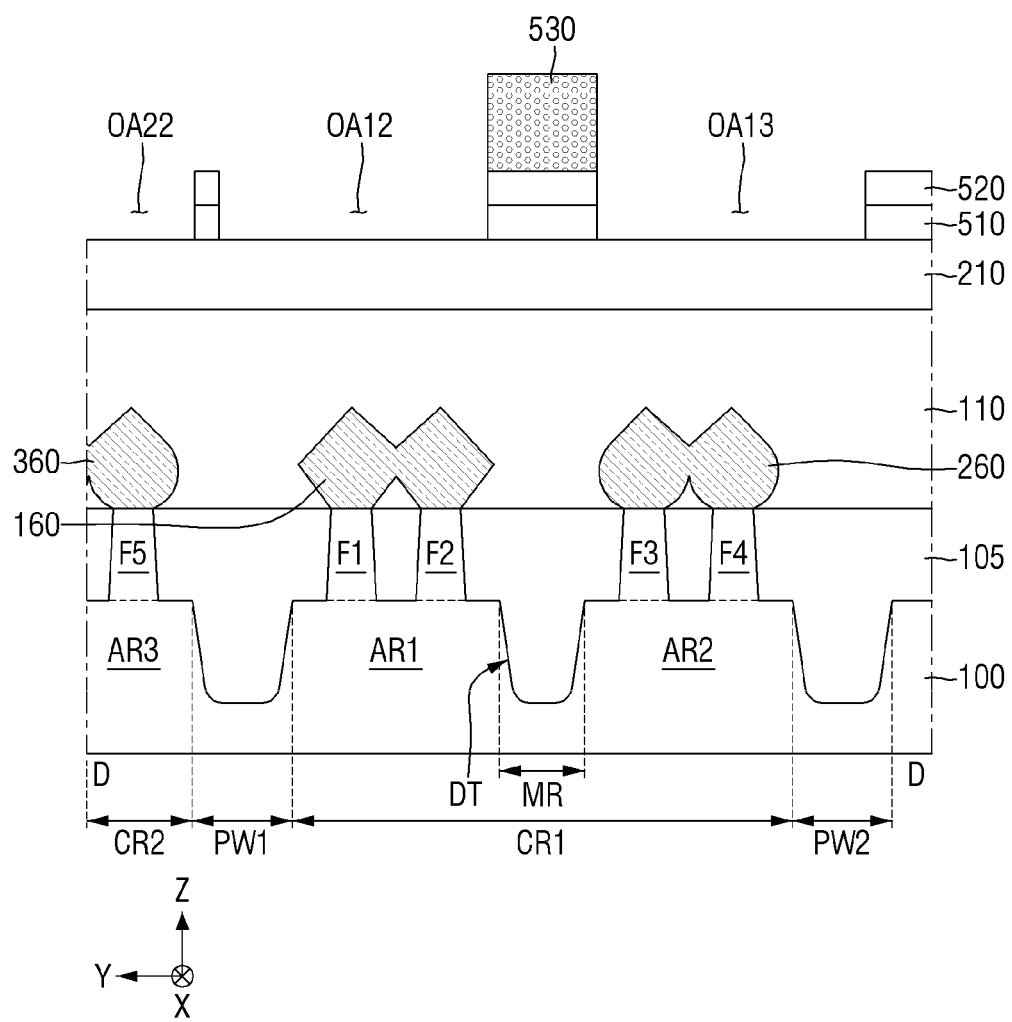

Referring to FIGS. 23 to 25, a protective pattern 530 is formed on the second interlayer insulating film 210. At least a part of the protective pattern 530 may be placed inside the intermediate region MR. For example, the protective pattern 530 may extend in the first direction X inside the intermediate region MR. At least a part of the protective pattern 530 may overlap the source/drain contact openings OA11 to OA22 placed inside the intermediate region MR accordingly. For example, the protective pattern 530 may overlap a part of the first source/drain contact opening OA11 placed inside the intermediate region MR.

The protective pattern 530 may not be placed inside the first power supply region PW1 and the second power supply region PW2. Accordingly, the protective pattern 530 may not overlap the source/drain contact openings OA11 to OA22 placed inside the first power supply region PW1 and the second power supply region PW2. For example, the protective pattern 530 may not overlap a part of the second source/drain contact opening OA12 placed inside the first power supply region PW1. The protective pattern 530 may include, but is not limited to, a Spin on Hardmask (SOH).

Figure 26:
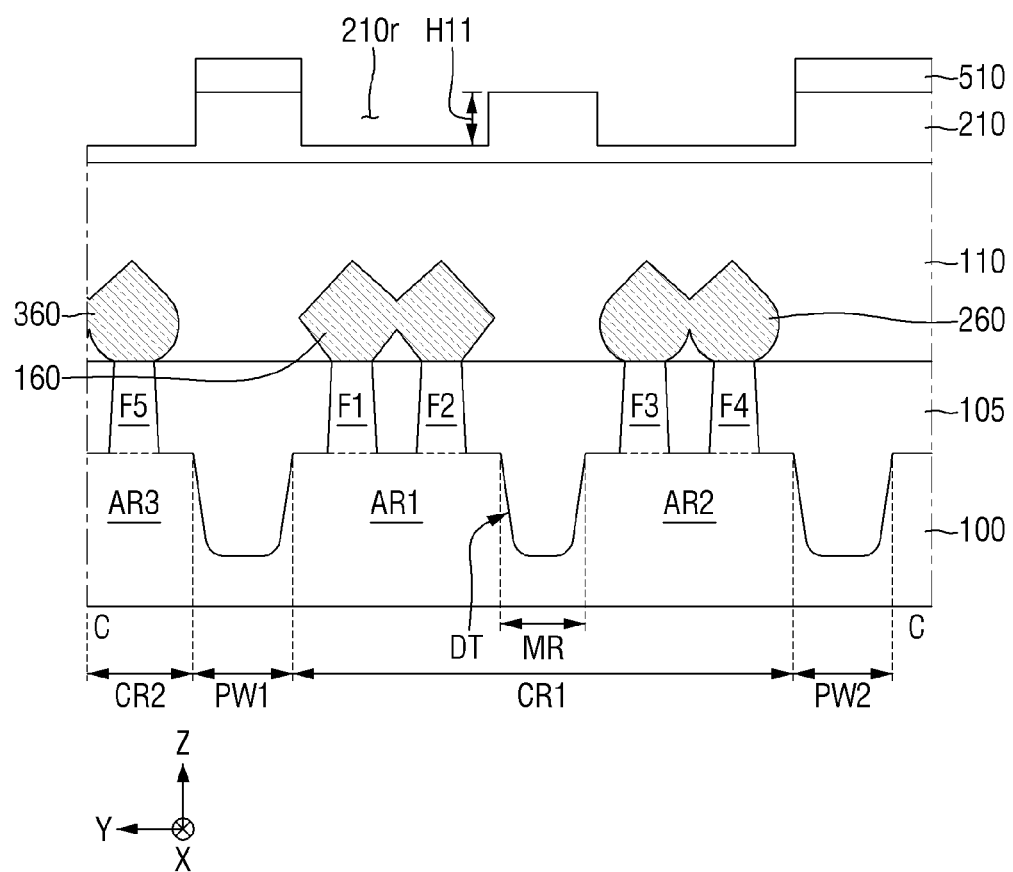
Figure 27:
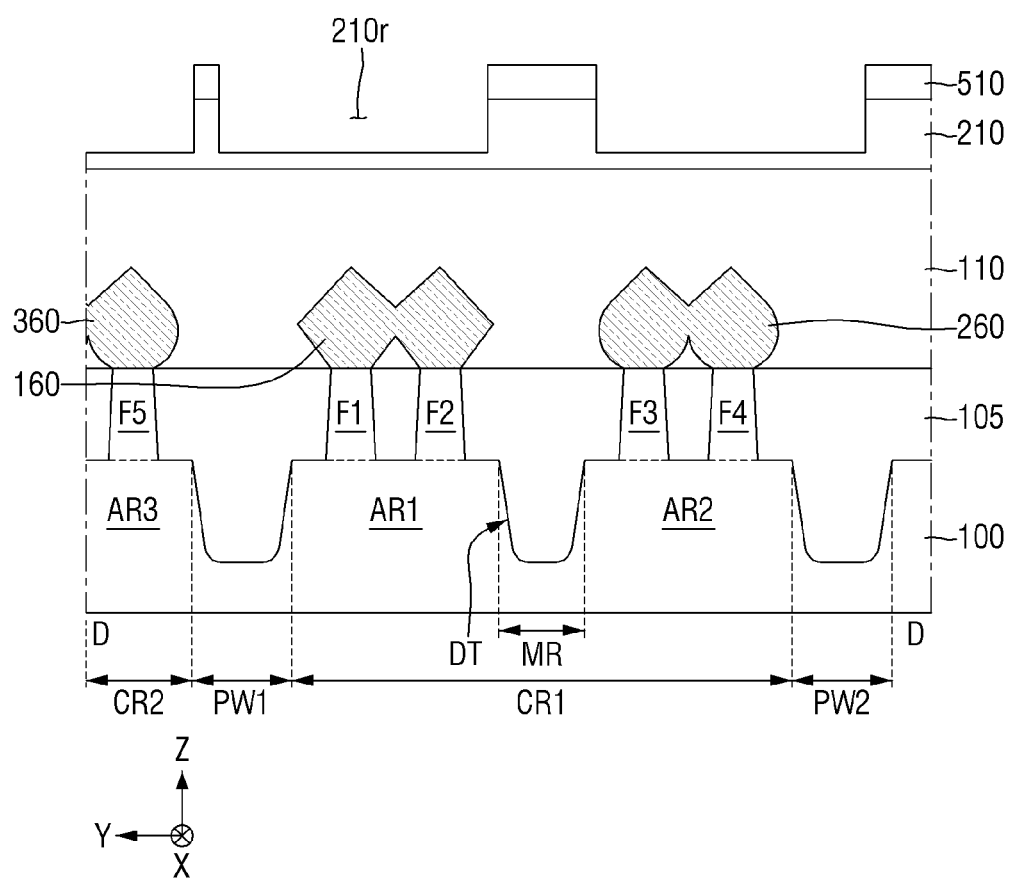

Referring now to FIGS. 23, 26 and 27, a first etching process which uses the first mask pattern 510, the second mask pattern 520 and the protective pattern 530 is performed. The first etching process may etch a part of the second interlayer insulating film 210 that overlaps the source/drain contact openings OA11 to OA22. For example, a third recess 210r may be formed in the second interlayer insulating film 210 that overlaps the source/drain contact opening OA11 to OA22.

The protective pattern 530 may protect the second interlayer insulating film 210 in the first etching process. For example, as shown in FIG. 26, a region of the second interlayer insulating film 210 that overlaps the protective pattern 530 may have a step H11 with a region of the second interlayer insulating film 210 that overlaps the source/drain contact openings OA11 to OA22 but does not overlap the protective pattern 530. As the first etching process is performed, the second mask pattern 520 and protective pattern 530 may be removed.

Figure 28:
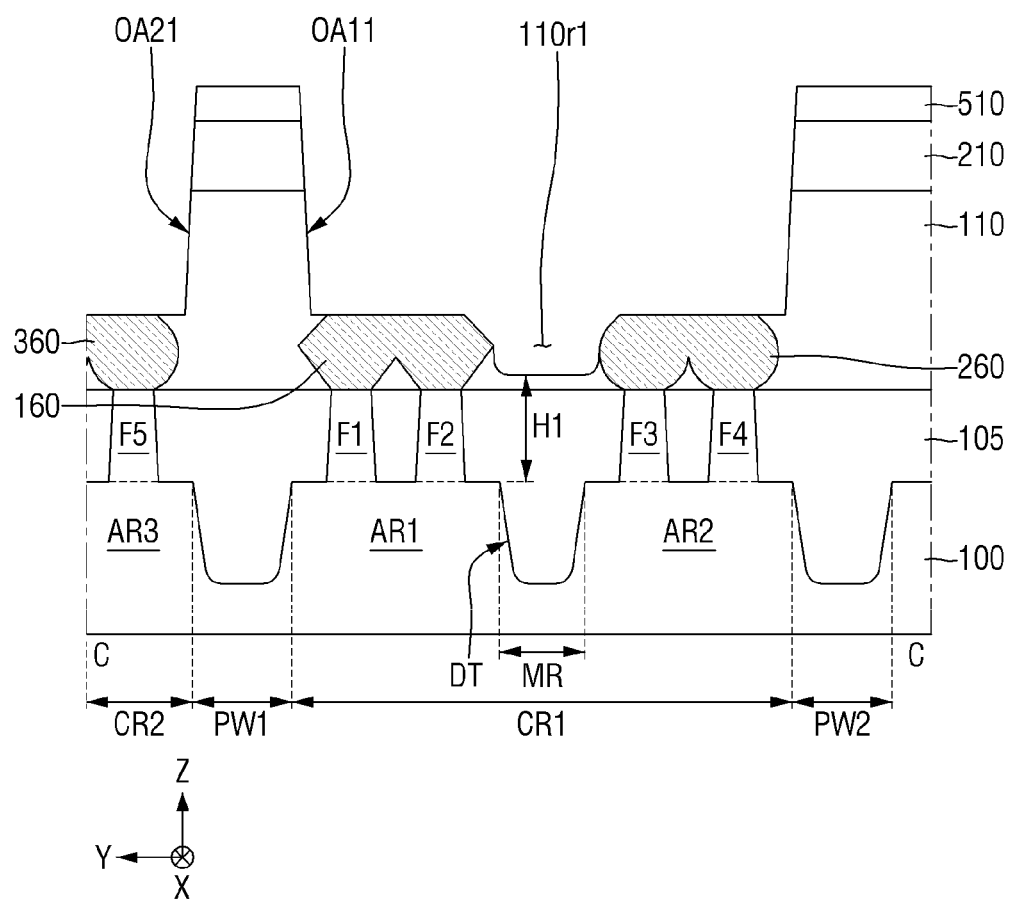
Figure 29:
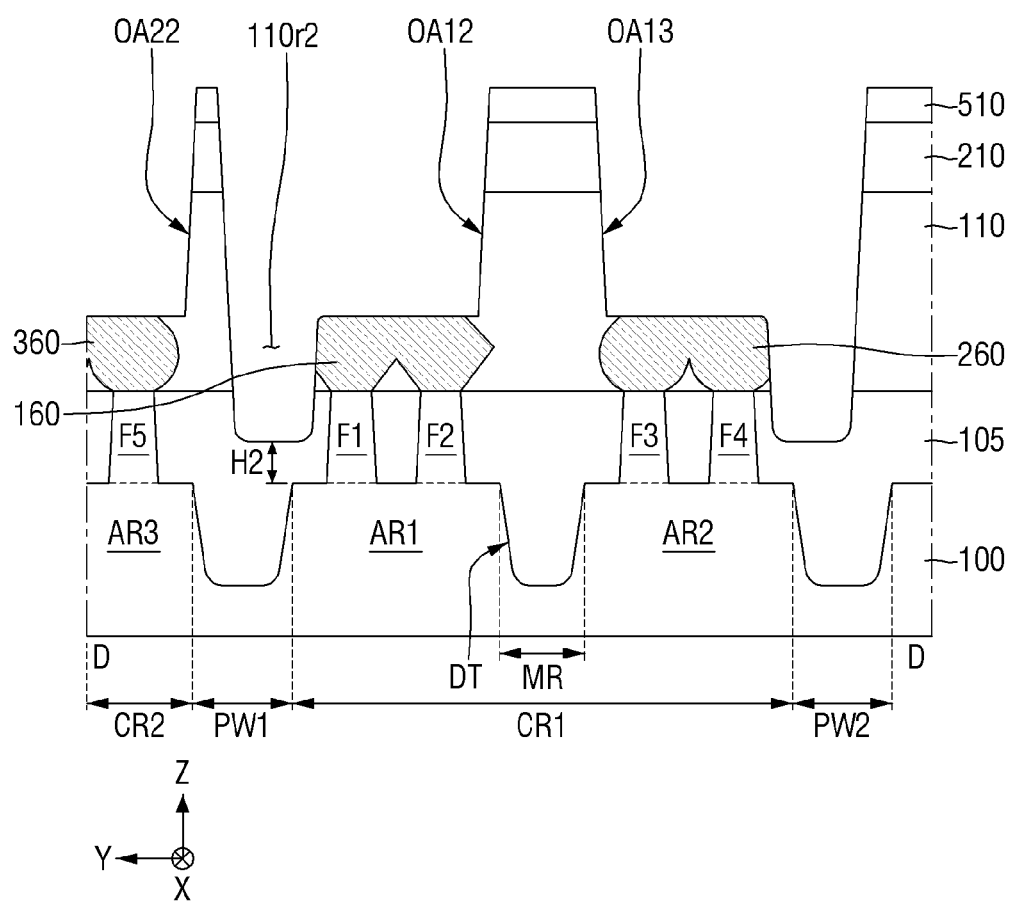

Referring to FIGS. 23, 28 and 29, a second etching process for exposing the first to third source/drain regions 160, 260 and 360 is performed. The second etching process may etch the first interlayer insulating film 110 and the second interlayer insulating film 210 that overlap the source/drain contact openings OA11 to OA22. The source/drain contact openings OA11 to OA22 may expose the first to third source/drain regions 160, 260 and 360 accordingly. In some embodiments, the second etching process may etch a part of the first to third source/drain regions 160, 260 and 360.

By the second etching process, the regions of the source/drain contact openings OA11 to OA22 that do not overlap the first to third source/drain regions 160, 260 and 360 may have a form that is recessed downward from the first to third source/drain regions 160, 260 and 360 toward the upper surface of the substrate 100. For example, the first source/drain contact opening OA11 may include a first recess 110r1 placed inside the intermediate region MR, and the second source/drain contact opening OA12 may include a second recess 110r2 placed inside the first power supply region PW1.

Before the second etching process is performed, because the region of the second interlayer insulating film 210 that overlaps the protective pattern 530 may have a step H11, the first recess 110r1 may be formed to be shallower than the second recess 110r2. For example, the first height H1 of the lowermost surface of the first recess 110r1 may be higher than the second height H2 of the lowermost surface of the second recess 110r2, on the basis of the upper surface of the substrate 100. The second etching process may be performed after the first etching process is executed, or may be performed in-situ with the first etching process.

Figure 30:
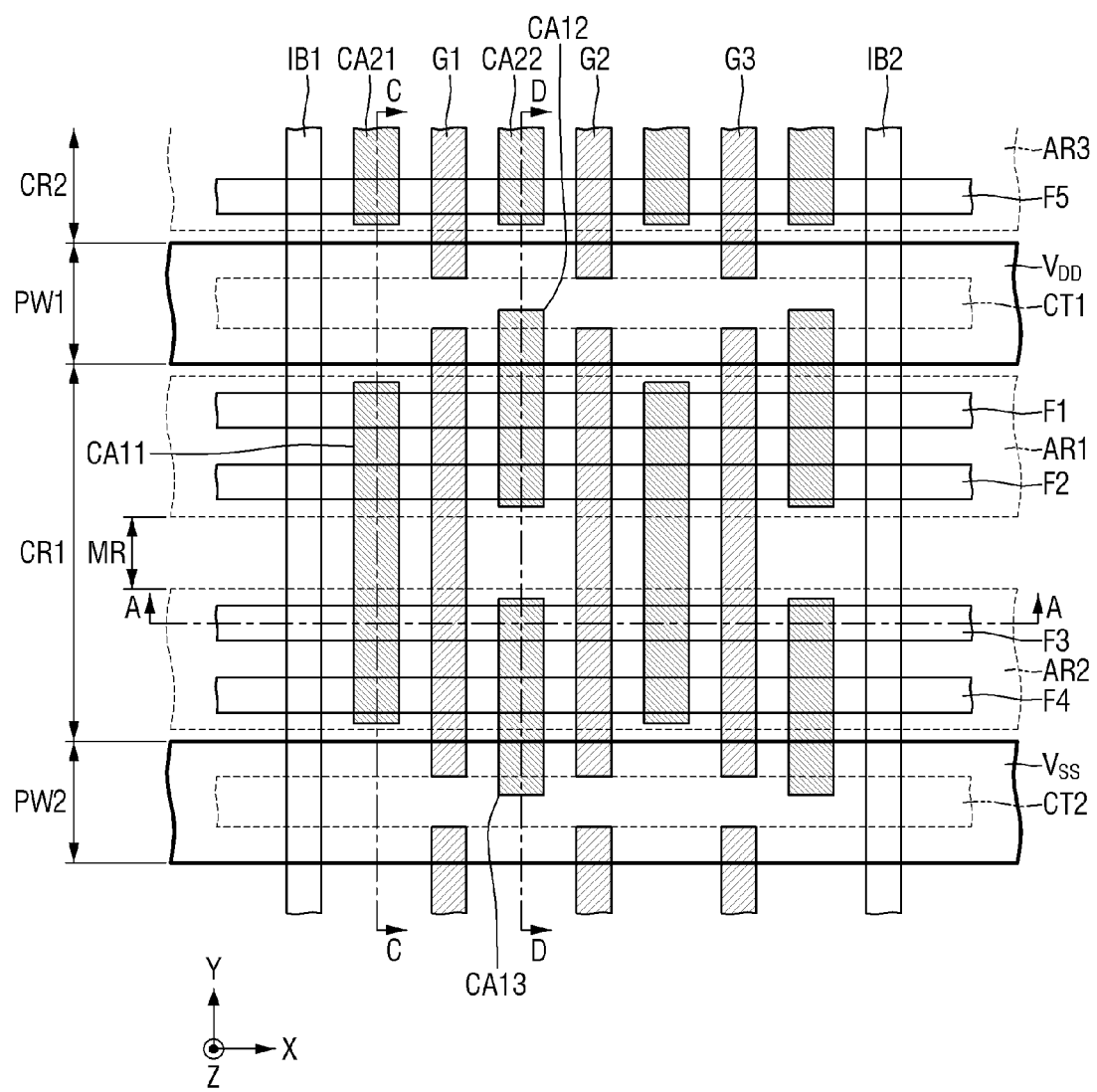
Figure 31:
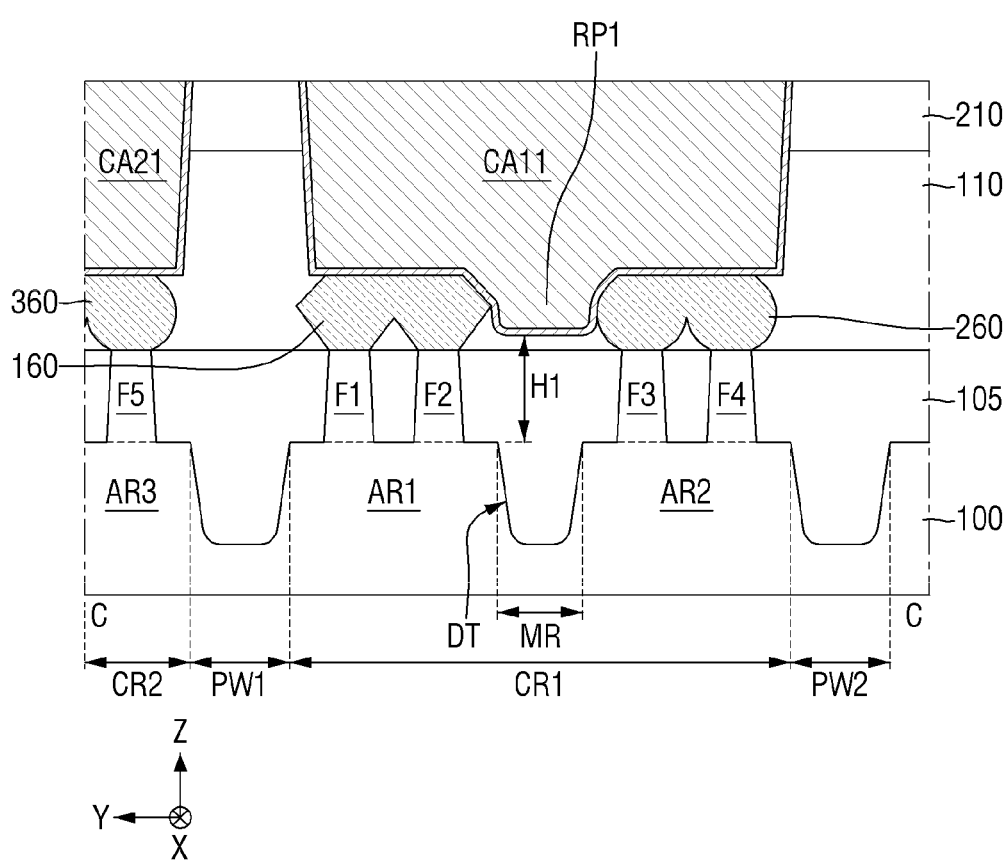
Figure 32:
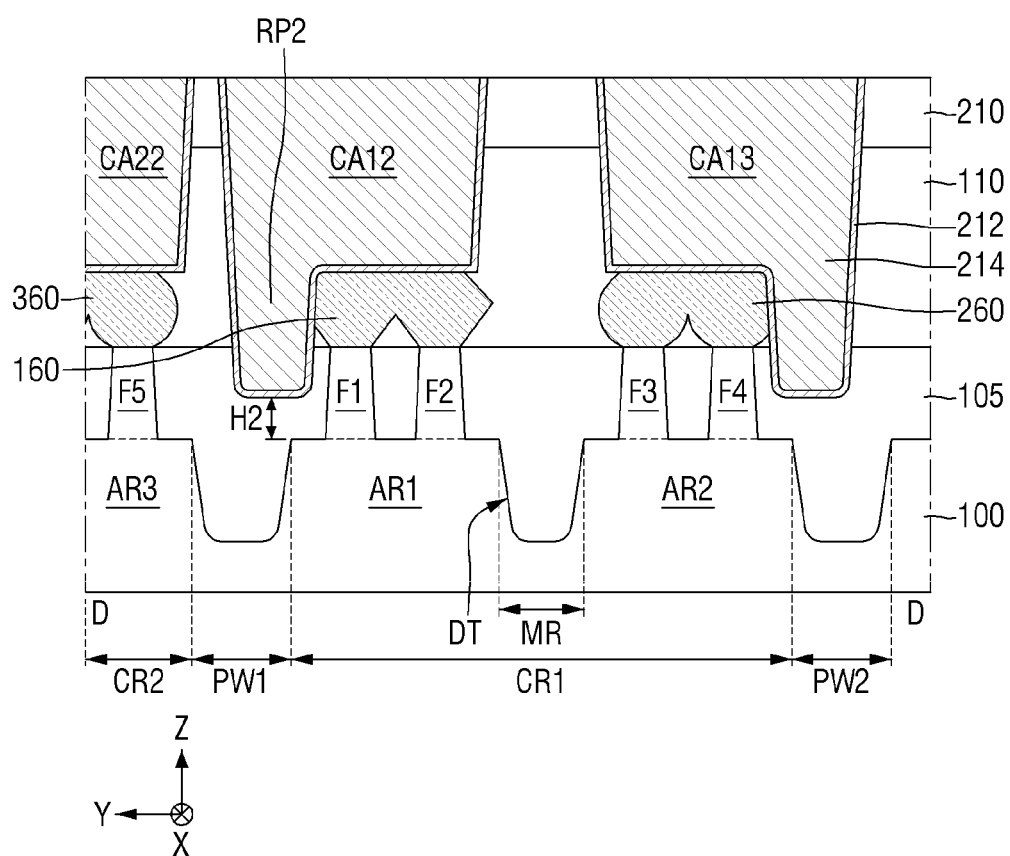

Referring to FIGS. 30 to 32, the source/drain contacts CA11 to CA22 are formed in the first interlayer insulating film 110 and the second interlayer insulating film 210. The source/drain contacts CA11 to CA22 may be formed to fill the source/drain contact openings (OA11 to OA22 of FIG. 23). Accordingly, the source/drain contacts CA11 to CA22 connected to the first active region AR1, the second active region AR2 or the third active region AR3 may be formed.

Further, the source/drain contacts CA11 to CA22 may be formed to fill the first recess (110r1 of FIG. 28) and the second recess (110r2 of FIG. 29). Accordingly, the first source/drain contact CA11 including the first recess portion RP1 may be formed, and the second source/drain contact CA12 including the second recess portion RP2 may be formed.

Figure 33:
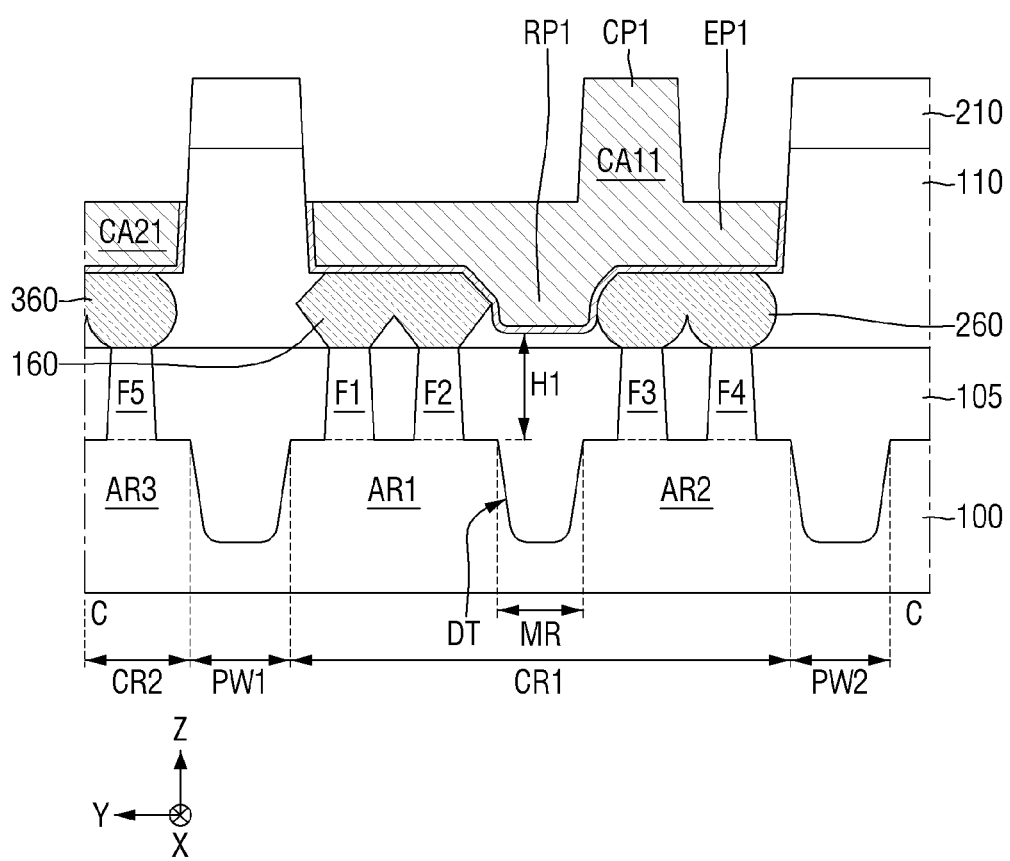
Figure 34:
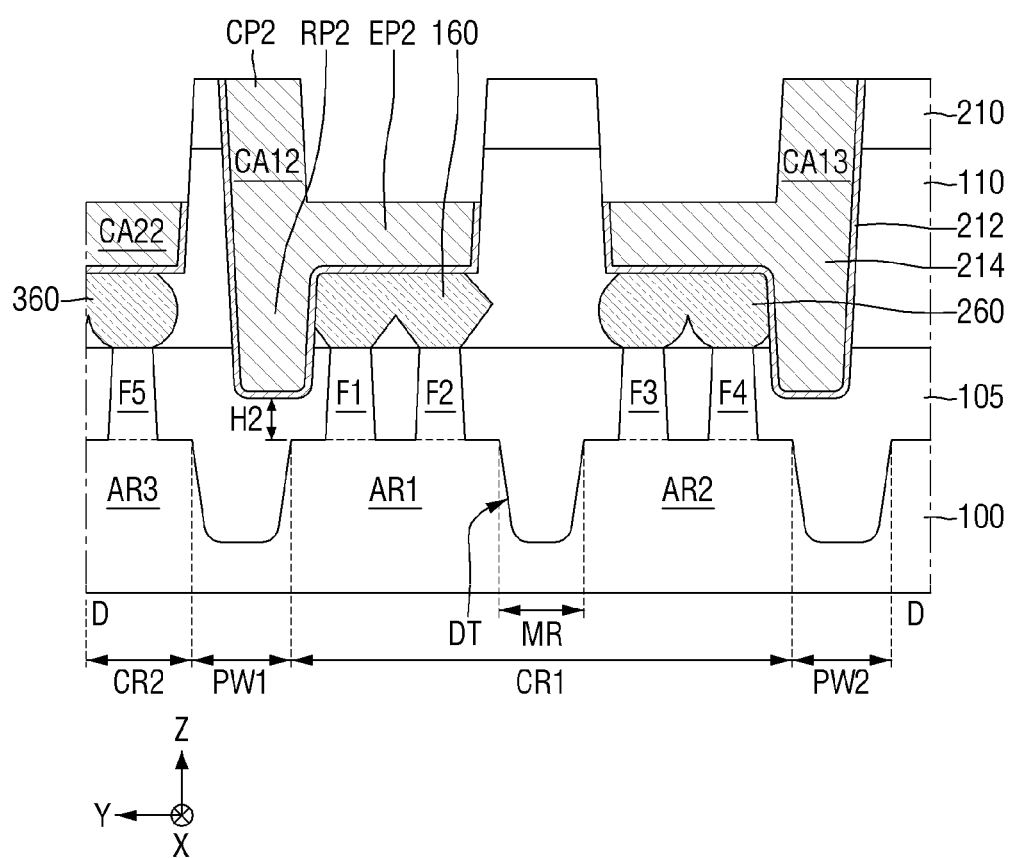

Referring to FIGS. 30, 33 and 34, a part of the source/drain contacts CA11 to CA22 is recessed. The regions of the source/drain contacts CA11 to CA22 that overlap the routing vias (VA of FIG. 1) may not be recessed. That is, at least a partial region of the source/drain contacts CA11 to CA22 that do not overlap the routing vias (VA of FIG. 1) may be recessed. Accordingly, the first source/drain contact CA11 including the first contact portion CP1 may be formed, and the second source/drain contact CA12 including the second contact portion CP2 may be formed.

Next, referring to FIGS. 1 to 7, the gate contacts CB, the routing vias VA, the routing wirings RW1 and RW2, the first power supply wiring $V_{DD}$, and the second power supply wiring Vss are formed. Accordingly, it is possible to provide a method for fabricating a semiconductor device in which the parasitic capacitance is reduced and the performance is improved.

Figure 35:
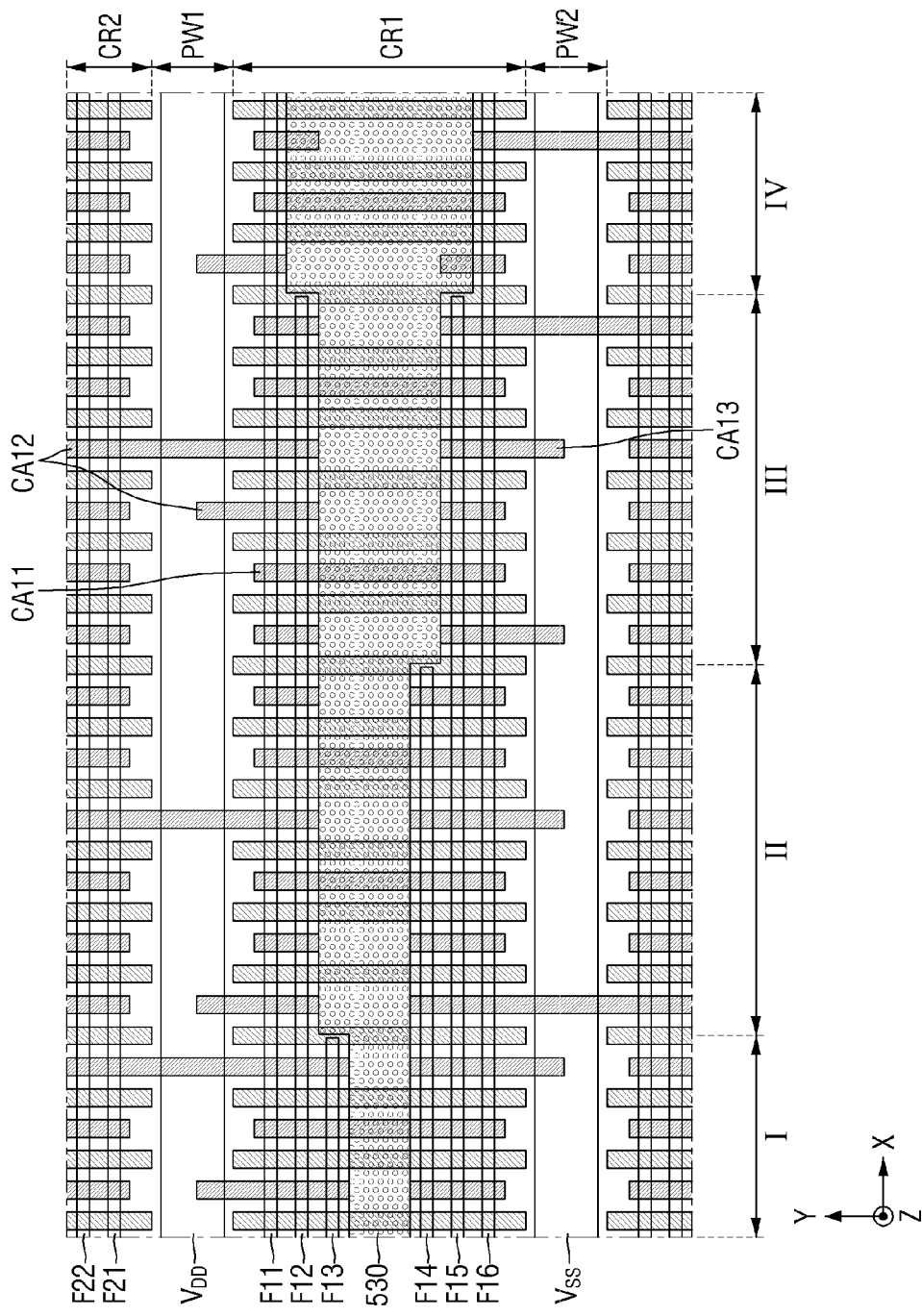
FIG. 35 is a plan view of a structure that illustrates a method of fabricating the semiconductor device according to some embodiments.

FIG. 35 is an intermediate stage diagram for explaining the method of fabricating the semiconductor device according to some embodiments. For convenience of explanation, repeated parts of contents explained above using FIGS. 14 to 34 will be briefly explained or omitted. Referring to FIG. 35, in the method for fabricating the semiconductor device according to some embodiments, the protective pattern 530 is interposed between the first active pattern groups F11 to F13 and the second active pattern groups F14 to F16.

The protective pattern 530 may not be placed inside the first power supply region PW1 and the second power supply region PW2. Accordingly, a first source/drain contact CA11, which is formed to be relatively shallow even though a part thereof is placed inside the intermediate region MR, may be formed. Further, a second source/drain contact CA12 (or the third source/drain contact CA13) which is formed to be relatively deeper may be formed in the first power supply region PW1 (or the second power supply region PW2).

In some embodiments, the protective pattern 530 may have different widths from each other in the first to fourth regions I to IV. Here, the width of the protective pattern 530 means a width in the second direction Y. As an example, as shown, the width of the protective pattern 530 may increase from the first region I toward the fourth region IV.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device, comprising:
    a substrate including a first power supply region and a second power supply region, and a cell region that extends between the first power supply region and the second power supply region;
    a first active region and a second active region extending side-by-side in a first direction, within the cell region;
    a first power supply wiring extending in the first direction within the first power supply region;
    a first source/drain contact which connects the first active region and the second active region; and
    a second source/drain contact which connects the first active region and the first power supply wiring;
    wherein the first source/drain contact includes a first recess portion disposed inside an intermediate region between the first active region and the second active region;
    wherein the second source/drain contact includes a second recess portion disposed inside the first power supply region; and
    wherein a lowermost surface of the first recess portion is higher than a lowermost surface of the second recess portion, relative to an upper surface of the substrate.

2. The semiconductor device of claim 1, wherein the first source/drain contact further includes a first extension portion which extends over the first active region, the intermediate region and the second active region; wherein the first recess portion protrudes from a lower surface of the first extension portion; wherein the second source/drain contact further includes a second extension portion which extends over the first power supply region and the first active region; and wherein the second recess portion protrudes from a lower surface of the second extension portion.

3. The semiconductor device of claim 2, further comprising:
    a routing wiring extending in the first direction and within the cell region;
    wherein the first source/drain contact further includes a first contact portion, which protrudes from an upper surface of the first extension portion and is connected to the routing wiring; and
    wherein the second source/drain contact further includes a second contact portion, which protrudes from an upper surface of the second extension portion and is connected to the first power supply wiring.

4. The semiconductor device of claim 1, further comprising:
    a gate electrode extending in a second direction, which intersects the first direction, on the substrate; and
    wherein the first source/drain contact is placed on one side of the gate electrode, and the second source/drain contact is placed on the other side of the gate electrode.

5. The semiconductor device of claim 1, further comprising:
    a first active pattern extending in the first direction, on the first active region;
    a second active pattern extending in the first direction, on the second active region; and
    a field insulating film which surrounds side surfaces of the first active pattern and side surfaces of the second active pattern, on the substrate.

6. The semiconductor device of claim 5, wherein a lowermost surface of the first recess portion is higher than an upper surface of the field insulating film, relative to the upper surface of the substrate.

7. The semiconductor device of claim 5, wherein a lowermost surface of the second recess portion is lower than the upper surface of the field insulating film, relative to the upper surface of the substrate.

8. The semiconductor device of claim 5, wherein the substrate further includes a substrate trench extending in the first direction, which separates the first active region from the second active region; and wherein the field insulating film at least partially fills the substrate trench.

9. The semiconductor device of claim 1, further comprising:
    a second power supply wiring extending in the first direction, inside the second power supply region; and
    a third source/drain contact which connects the second active region and the second power supply wiring;
    wherein the third source/drain contact includes a third recess portion disposed inside the second power supply region; and
    wherein a lowermost surface of the first recess portion is higher than a lowermost surface of the third recess portion, relative to the upper surface of the substrate.

10. A semiconductor device, comprising:
    a substrate including a first cell region and a second cell region extending in a first direction side-by-side, and a power supply region extending between the first cell region and the second cell region;
    a first active region and a second active region extending in a first direction side-by-side within the first cell region;
    a gate electrode extending in a second direction intersecting first direction on the substrate;
    power supply wiring extending in a first direction inside the power supply region;
    a first source/drain contact connected to the first active region, on one side of the gate electrode; and
    a second source/drain contact, which connects the first active region and the power supply wiring, on the other side of the gate electrode;
    wherein the first source/drain contact includes a first recess portion placed inside an intermediate region between the first active region and the second active region;
    wherein the second source/drain contact includes a second recess portion extending inside the power supply region; and
    wherein a lowermost surface of the first recess portion is higher than a lowermost surface of the second recess portion, relative to an upper surface of the substrate.

11. The semiconductor device of claim 10, wherein the first source/drain contact further includes a first extension portion, which extends over the first active region, the intermediate region and the second active region; wherein the first recess portion protrudes from a lower surface of the first extension portion; wherein the second source/drain contact further includes a second extension portion, which extends over the power supply region and the first active region in the second direction; and wherein the second recess portion protrudes from a lower surface of the second extension portion.

12. The semiconductor device of claim 10, wherein the first source/drain contact connects the first active region to the second active region.

13. The semiconductor device of claim 10, further comprising routing wiring extending in the first direction, inside the first cell region; and wherein the first source/drain contact connects the first active region to the routing wiring.

14. The semiconductor device of claim 10, wherein the substrate further includes a third active region extending in the first direction, inside the second cell region; and wherein the second source/drain contact connects the first active region to the third active region.

15. The semiconductor device of claim 10, further comprising a gate cutting pattern, which extends in the first direction and cuts the gate electrode, and extends inside the power supply region.

16. A semiconductor device, comprising:
   a substrate having a cell region therein, which extends between a first power supply region and a second power supply region extending in a first direction side by side, and, said cell region including a first active region and a second active region at side-by-side locations therein;
   a first active pattern extending in the first direction, on the first active region;
   a second active pattern extending in the first direction, on the second active region;
   a gate electrode extending in a second direction intersecting the first direction, on the first active pattern and the second active pattern;
   an insulating film which covers the first active pattern, the second active pattern and the gate electrode, on the substrate;
   a first power supply wiring, which extends in the first direction and provides a first power supply voltage, within the first power supply region;
   a second power supply wiring, which extends in the first direction and provides a second power supply voltage different from the first power supply voltage, inside the second power supply region;
   a first source/drain contact, which connects a source/drain region of the first active pattern and a source/drain region of the second active pattern, inside the insulating film; and
   a second source/drain contact, which connects the source/drain region of the first active pattern and the first power supply wiring, inside the insulating film;
   wherein the insulating film includes a first recess, which is placed between the first active region and the second active region and has a first depth, and a second recess, which is placed within the first power supply region and has a second depth deeper than the first depth;
   wherein the first source/drain contact includes a first recess portion that fills the first recess, and
   wherein the second source/drain contact includes a second recess portion that fills the second recess.

17. The semiconductor device of claim 16, further comprising:
   a field insulating film which surrounds side surfaces of the first active pattern and side surfaces of the second active pattern, on the substrate, and
   an interlayer insulating film, which covers the gate electrode, a source/drain region of the first active pattern, and a source/drain region of the second active pattern, on the field insulating film.

18. The semiconductor device of claim 16, further comprising:
   a routing wiring extending in the first direction, inside the cell region,
   wherein the first source/drain contact connects the source/drain region of the first active pattern and the routing wiring.

19. The semiconductor device of claim 16, wherein the first depth is 20 nm to 40 nm, and the second depth is 50 nm to 70 nm, relative to an uppermost portion of the source/drain region of the first active pattern.

20. The semiconductor device of claim 16, wherein the first active region and the second active region have different conductivity types.

* * * * *